(12) United States Patent
Kaneko et al.

(10) Patent No.: US 9,159,536 B2
(45) Date of Patent: Oct. 13, 2015

(54) PLASMA PROCESSING APPARATUS, ABNORMAL OSCILLATION DETERMINATION METHOD AND HIGH-FREQUENCY GENERATOR

(71) Applicant: TOKYO ELECTRON LIMITED, Tokyo (JP)

(72) Inventors: Kazushi Kaneko, Miyagi (JP); Kazunori Funazaki, Miyagi (JP); Yunosuke Hashimoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/333,691

(22) Filed: Jul. 17, 2014

(65) Prior Publication Data

US 2015/0022086 A1 Jan. 22, 2015

(30) Foreign Application Priority Data

Jul. 19, 2013 (JP) .................................. 2013-151064

(51) Int. Cl.

| H01J 7/24 | (2006.01) |
| H05B 31/26 | (2006.01) |
| H01J 37/32 | (2006.01) |
| H05H 1/46 | (2006.01) |

(52) U.S. Cl.
CPC ...... *H01J 37/32183* (2013.01); *H01J 37/32192* (2013.01); *H01J 37/32311* (2013.01); *H01J 37/32935* (2013.01); *H05H 2001/4682* (2013.01)

(58) Field of Classification Search
CPC ............. H05H 1/46; H05H 1/12; H05H 1/24; H05H 1/54; H01J 37/32082; H01J 37/32192

USPC ................... 315/111.21, 111.01; 313/231.31, 313/231.01
See application file for complete search history.

(56) References Cited

U.S. PATENT DOCUMENTS

| 6,184,623 | B1 * | 2/2001 | Sugai et al. ............... 315/111.21 |
| 6,391,147 | B2 * | 5/2002 | Imafuku et al. .......... 156/345.47 |
| 6,910,440 | B2 * | 6/2005 | Ishii et al. ............. 118/723 MW |
| 2002/0188367 | A1 * | 12/2002 | Hayashi ......................... 700/110 |
| 2006/0220573 | A1 * | 10/2006 | Kotani et al. ............. 315/111.21 |
| 2007/0121267 | A1 * | 5/2007 | Kotani et al. .................... 361/85 |
| 2010/0095888 | A1 * | 4/2010 | Mori et al. ..................... 118/663 |
| 2010/0236917 | A1 * | 9/2010 | Mori ............................. 204/164 |
| 2014/0225504 | A1 * | 8/2014 | Kaneko et al. ........... 315/111.21 |

FOREIGN PATENT DOCUMENTS

WO 2004/068917 A1 8/2004

* cited by examiner

*Primary Examiner* — Dylan White
(74) *Attorney, Agent, or Firm* — Rothwell, Figg, Ernst & Manbeck, P.C.

(57) ABSTRACT

A plasma processing apparatus includes a processing container and a plasma generating mechanism including a high-frequency oscillator. The arrangement is configured to generate plasma within the processing container by using a high frequency wave oscillated by the high-frequency oscillator. In addition, an impedance regulator is configured to adjust impedance to be applied to the high-frequency oscillator. Further, a determining unit is configured to change the impedance to be adjusted by the impedance regulator and to determine an abnormal oscillation of the high-frequency oscillator based on (a) a component of a center frequency of a fundamental wave that is the high frequency wave oscillated by the high-frequency oscillator, and (b) a component of a peripheral frequency present at both ends of a predetermined frequency band centered around the center frequency of the fundamental wave in a state where the impedance is changed.

7 Claims, 15 Drawing Sheets

FIG.7

| PHASE | POWER OF ABNORMAL OSCILLATION OCCURRENCE W | | | | | |
|---|---|---|---|---|---|---|
| | VSWR: 1.0 | | VSWR: 1.5 | | VSWR: 3.0 | |
| | OCCUR-RENCE RANGE | RANGE | OCCUR-RENCE RANGE | RANGE | OCCUR-RENCE RANGE | RANGE |
| 0.05 $\lambda$g | NORMAL OSCILLATION IN RANGE OF 1000~5000W | | NORMAL OSCILLATION IN RANGE OF 1000~5000W | | NORMAL OSCILLATION IN RANGE OF 1000~5000W | |
| 0.50 $\lambda$g | | | | | | |
| 0.45 $\lambda$g | | | | | | |
| 0.40 $\lambda$g | | | | | | |
| 0.35 $\lambda$g | | | | | | |
| 0.30 $\lambda$g | | | | | | |
| 0.25 $\lambda$g | | | 1400~1900 | 500 | | |

FIG.8

| PHASE | POWER OF ABNORMAL OSCILLATION OCCURRENCE W | | | | | |
|---|---|---|---|---|---|---|
| | VSWR: 1.0 | | VSWR: 1.5 | | VSWR: 3.0 | |
| | OCCUR-RENCE RANGE | RANGE | OCCUR-RENCE RANGE | RANGE | OCCUR-RENCE RANGE | RANGE |
| 0.05 $\lambda$g | NORMAL OSCILLATION IN RANGE OF 1000~5000W | | NORMAL OSCILLATION IN RANGE OF 1000~5000W | | NORMAL OSCILLATION IN RANGE OF 1000~5000W | |
| 0.50 $\lambda$g | | | | | | |
| 0.45 $\lambda$g | | | | | | |
| 0.40 $\lambda$g | | | | | | |
| 0.35 $\lambda$g | | | | | | |
| 0.30 $\lambda$g | | | | | 1200~1600 | 400 |
| 0.25 $\lambda$g | | | 1900~2700 | 800 | 1500~2100 | 600 |

FIG.9

| PHASE | POWER OF ABNORMAL OSCILLATION OCCURRENCE W ||||||
|---|---|---|---|---|---|---|
| | VSWR: 1.0 || VSWR: 1.5 || VSWR: 3.0 ||
| | OCCUR-RENCE RANGE | RANGE | OCCUR-RENCE RANGE | RANGE | OCCUR-RENCE RANGE | RANGE |
| 0.05 $\lambda g$ | NORMAL OSCILLATION IN RANGE OF 1000~5000W || NORMAL OSCILLATION IN RANGE OF 1000~5000W || NORMAL OSCILLATION IN RANGE OF 1000~5000W ||
| 0.50 $\lambda g$ | ~ || ~ || ~ ||
| 0.45 $\lambda g$ | ~ || ~ || ~ ||
| 0.40 $\lambda g$ | ~ || ~ || ~ ||
| 0.35 $\lambda g$ | ~ || ~ || 1600~1900 | 300 |
| 0.30 $\lambda g$ | ~ || ~ || 1600~2300 | 700 |
| 0.25 $\lambda g$ | ~ || 2000~2800 | 800 | 2600~2900 | 300 |

FIG.10

| PHASE | POWER OF ABNORMAL OSCILLATION OCCURRENCE W ||||||
|---|---|---|---|---|---|---|
| | VSWR: 1.0 || VSWR: 1.5 || VSWR: 3.0 ||
| | OCCUR-RENCE RANGE | RANGE | OCCUR-RENCE RANGE | RANGE | OCCUR-RENCE RANGE | RANGE |
| 0.05 $\lambda g$ | 1600~2700 | 1100 | 2100~2300 | 200 | NORMAL OSCILLATION ||
| 0.50 $\lambda g$ | ~ || NORMAL OSCILLATION IN RANGE OF 1000~5000W || 1400~1900 | 500 |
| 0.45 $\lambda g$ | ~ || ~ || 1100~1800 | 700 |
| 0.40 $\lambda g$ | ~ || ~ || 800~1800 | 1000 |
| 0.35 $\lambda g$ | ~ || ~ || 900~2000 | 1100 |
| 0.30 $\lambda g$ | ~ || 2100~2300 | 200 | 1200~2300 | 1100 |
| 0.25 $\lambda g$ | ~ || 1400~2600 | 1200 | 2200~2300 | 100 |

PLASMA PROCESSING APPARATUS, ABNORMAL OSCILLATION DETERMINATION METHOD AND HIGH-FREQUENCY GENERATOR

CROSS-REFERENCE TO RELATED APPLICATIONS

This application is based on and claims priority from Japanese Patent Application No. 2013-151064, filed on Jul. 19, 2013, with the Japan Patent Office, the disclosure of which is incorporated herein in its entirety by reference.

TECHNICAL FIELD

Various aspects and exemplary embodiments of the present disclosure relate to a plasma processing apparatus, an abnormal oscillation determination method, and a high-frequency generator.

BACKGROUND

There is a plasma processing apparatus configured to excite plasma by using a microwave. The plasma processing apparatus includes a high-frequency oscillator such as, for example, a magnetron, and radiates a microwave oscillated by the high-frequency oscillator into a processing container so that a gas within the processing container is ionized to excite plasma (WO No. 2004/068917).

SUMMARY

The present disclosure provides a plasma processing apparatus including: a processing container; a plasma generating mechanism including a high-frequency oscillator, and configured to generate plasma within the processing container by using a high frequency wave oscillated by the high-frequency oscillator; an impedance regulator configured to adjust impedance to be applied to the high-frequency oscillator; and a determining unit configured to change the impedance to be adjusted by the impedance regulator, and to determine an abnormal oscillation of the high-frequency oscillator based on a component of a center frequency of a fundamental wave that is the high frequency wave oscillated by the high-frequency oscillator, and a component of a peripheral frequency present at both ends of a predetermined frequency band centered around the center frequency of the fundamental wave in a state where the impedance is changed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 7 is a view illustrating an example of measurements of an abnormal oscillation of a magnetron when impedance of an impedance regulator is changed in the first exemplary embodiment.

FIG. 8 is a view illustrating an example of measurements of an abnormal oscillation of a magnetron when impedance of an impedance regulator is changed in the first exemplary embodiment.

FIG. 9 is a view illustrating an example of measurements of an abnormal oscillation of a magnetron when impedance of an impedance regulator is changed in the first exemplary embodiment.

FIG. 10 is a view illustrating an example of measurements of an abnormal oscillation of a magnetron when impedance of an impedance regulator is changed in the first exemplary embodiment.

DETAILED DESCRIPTION

Figure 1:
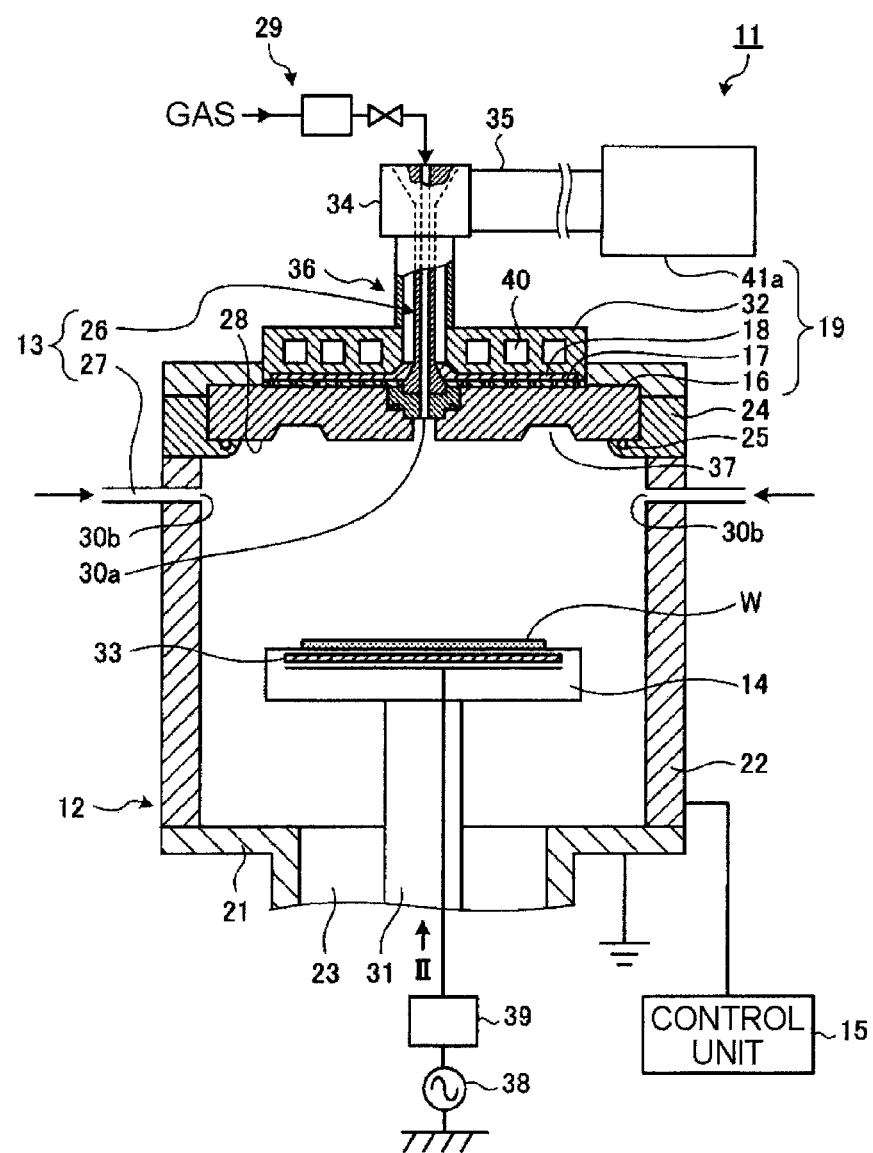
FIG. 1 is a schematic cross-sectional view illustrating a main portion of a plasma processing apparatus according a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

However, in the above described plasma processing apparatus, as the usage time of the high-frequency oscillator is increased, a frequency of occurrence of an abnormal oscillation of the high-frequency oscillator is increased. The abnormal oscillation of the high-frequency oscillator refers to a phenomenon in which the waveform of the microwave oscillated by the high-frequency oscillator is disturbed. The abnormal oscillation of the high-frequency oscillator generates a reflected wave of the microwave, thereby causing a reduction of a performance of the high-frequency oscillator. Accordingly, in the plasma processing apparatus, it is required to properly determine the abnormal oscillation of the high-frequency oscillator.

A plasma processing apparatus according to an aspect of the present disclosure includes: a processing container; a plasma generating mechanism including a high-frequency oscillator, and configured to generate plasma within the processing container by using a high frequency wave oscillated by the high-frequency oscillator; an impedance regulator configured to adjust impedance to be applied to the high-frequency oscillator; and a determining unit configured to change the impedance to be adjusted by the impedance regulator, and to determine the abnormal oscillation of the high-frequency oscillator based on a component of a center frequency of a fundamental wave that is the high frequency wave oscillated by the high-frequency oscillator and a component of a peripheral frequency present at both ends of a predetermined frequency band centered around the center frequency of the fundamental wave in a state where the impedance is changed.

The plasma processing apparatus according to the aspect of the present disclosure further includes a spectrum level detecting unit configured to detect a spectrum level of the component of the center frequency, and a spectrum level of the component of the peripheral frequency. The determining unit calculates a difference between a value of the spectrum level of the component of the center frequency and a value of the spectrum level of the component of the peripheral frequency, the spectrum levels being detected by the spectrum level detecting unit, in a state where the impedance is changed, determines whether the calculated value of the difference is not greater than a predetermined threshold value, and determines that the abnormal oscillation of the high-frequency oscillator has occurred when it is determined that the value of the difference is not greater than the threshold value.

In the plasma processing apparatus according to the aspect of the present disclosure, the spectrum level detecting unit detects the spectrum level of the component of the center frequency, and spectrum levels of components of a plurality of peripheral frequencies. The determining unit calculates a first difference between a value of the spectrum level of the component of the center frequency and a value of the spectrum level of the component of one of the plurality of peripheral frequencies, the spectrum levels being detected by the spectrum level detecting unit, in a state where the impedance is changed, and a second difference between the value of the spectrum level of the component of the center frequency and a value of the spectrum level of the component of another peripheral frequency which is different from the one peripheral frequency, determines whether the calculated value of the first difference is not greater than the threshold value and the calculated value of the second difference is not greater than another threshold value which is different from the threshold value, and determines that the abnormal oscillation of the high-frequency oscillator has occurred when the value of the first difference is not greater than the threshold value and the value of the second difference is not greater than the another threshold value.

In the plasma processing apparatus according to the aspect of the present disclosure, the determining unit determines the abnormal oscillation of the high-frequency oscillator based on the component of the center frequency of the fundamental wave and a component of a frequency of a different frequency wave occurring outside of both ends of the predetermined frequency band centered around the center frequency of the fundamental wave in a state where the impedance is changed.

The plasma processing apparatus further includes a notification unit configured to notify a determination result made by the determining unit.

Another aspect of the present disclosure is to provide a method of determining an abnormal oscillation using a plasma processing apparatus which includes a processing container, a plasma generating mechanism including a high-frequency oscillator, and configured to generate plasma within the processing container by using a high frequency wave oscillated by the high-frequency oscillator, and an impedance regulator configured to adjust impedance to be applied to the high-frequency oscillator. The method includes changing the impedance to be adjusted by the impedance regulator, and determining the abnormal oscillation of the high-frequency oscillator based on a component of a center frequency of a fundamental wave that is the high frequency wave oscillated by the high-frequency oscillator, and a component of a peripheral frequency present at both ends of a predetermined frequency band centered around the center frequency of the fundamental wave in a state where the impedance is changed.

A high-frequency generator according to a further aspect of the present disclosure includes: a high-frequency oscillator configured to oscillate a high frequency wave; an impedance regulator configured to adjust impedance to be applied to the high-frequency oscillator; and a determining unit configured to change the impedance to be adjusted by the impedance regulator and to determine the abnormal oscillation of the high-frequency oscillator based on a component of a center frequency of a fundamental wave that is the high frequency wave oscillated by the high-frequency oscillator and a component, of a peripheral frequency present at both ends of a predetermined frequency band centered around the center frequency of the fundamental wave in a state where the impedance is changed.

According to the plasma processing apparatus of the present disclosure, an effect of appropriately determining the abnormal oscillation of a high-frequency oscillator is achieved.

Hereinafter, descriptions will be made in detail on exemplary embodiments of the plasma processing apparatus, the abnormal oscillation determination method and the high-frequency generator with reference to drawings. Meanwhile, the present disclosure is not limited by the exemplary embodiments. The respective exemplary embodiments may be appropriately combined within a range which does not cause a contradiction in processing contents.

First Exemplary Embodiment

Figure 2:
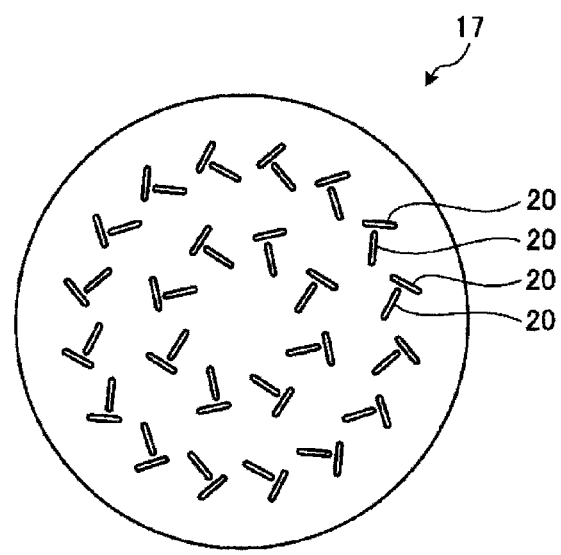
FIG. 2 is a view of a slot antenna plate included in the plasma processing apparatus illustrated in FIG. 1, when viewed in the direction of arrow II in FIG. 1.

FIG. 1 is a schematic cross-sectional view illustrating a main portion of a plasma processing apparatus according to a first exemplary embodiment. FIG. 2 is a view of a slot antenna plate included in the plasma processing apparatus illustrated in FIG. 1, when viewed from a bottom side, that is, in the direction of arrow II in FIG. 1. In FIG. 1, hatching of some members is omitted for an easy understanding. In this exemplary embodiment, the direction indicated by arrow II in FIG. 1 or its reverse direction that is the vertical direction in the paper sheet in FIG. 1 is considered as the vertical direction of the plasma processing apparatus.

Referring to FIGS. 1 and 2, a plasma processing apparatus 11 performs a processing by using plasma on a substrate to be processed W (a substrate W) as an object to be processed. Specifically, the plasma processing apparatus 11 performs a processing such as, for example, etching, CVD, or sputtering. The substrate W may be, for example, a silicon substrate to be used for manufacturing a semiconductor device.

The plasma processing apparatus 11 includes a processing container 12 in which a plasma processing is performed on a substrate W, a gas supply unit 13 configured to supply a gas for plasma excitation or a gas for plasma processing into the processing container 12, a disk-shaped holding unit 14 provided within the processing container 12 and configured to hold the substrate W thereon, a plasma generating mechanism 19 configured to generate plasma within the processing container 12 by using a microwave, and a control unit 15 configured to control the entire operation of the plasma processing apparatus 11. The control unit 15 performs the entire control of the plasma processing apparatus 11, for example, the control of a gas flow rate in the gas supply unit 13, and a pressure within the processing container 12.

The processing container 12 includes a bottom section 21 positioned below the holding unit 14, and a side wall 22 extending upwardly from the outer circumference of the bottom section 21. The side wall 22 has a substantially cylindrical shape. An exhausting hole 23 for exhausting a gas is formed at the bottom section 21 of the processing container 12 to extend through a portion of the bottom section 21. The top side of the processing container 12 is opened, and the processing container 12 is configured to be sealed by a cover unit 24 disposed on the top of the processing container 12, a dielectric window 16 to be described later, and an O ring 25 as a sealing member interposed between the dielectric window 16 and the cover unit 24.

The gas supply unit 13 includes a first gas supply unit 26 configured to supply a gas toward the center of the substrate W through a first flow path, and a second gas supply unit 27 configured to supply a gas from the outside of the substrate W through a second flow path. A gas supply hole 30a communicated with the first flow path and configured to supply the gas from the first gas supply unit 26 is formed at the center of the dielectric window 16 in a diametrical direction, that is, a position retracted inwardly into the dielectric window 16 than the bottom surface 28 of the dielectric window 16. The bottom surface 28 faces the holding unit 14. The first gas supply unit 26 supplies an inert gas for plasma excitation or a gas for plasma processing while controlling, for example, a flow rate, through a gas supply system 29 connected to the first gas supply unit 26. The second gas supply unit 27 is formed by forming a plurality of gas supply holes 30b at a portion of the upper portion of the side wall 22. The plurality of gas supply holes 30b are configured to supply an inert gas for plasma excitation or a gas for plasma processing into the processing container 12. The plurality of gas supply holes 30b are formed at equal intervals in the circumferential direction. The first gas supply unit 26 and the second gas supply unit 27 are supplied with the same kind of inert gas for plasma excitation or the same kind of gas for plasma processing from a common gas supply source. Also, according to a demand or a control specification, different gases may be supplied from the first gas supply unit 26 and the second gas supply unit 27, and, for example, the flow rate ratio thereof may be adjusted.

In the holding unit 14, a high frequency power source 38 for RF (radio frequency) bias is electrically connected to an electrode within the holding unit 14 via a matching unit 39. The high frequency power source 38 is capable of outputting a predetermined power (bias power) having a high frequency of, for example, 13.56 MHz. The matching unit 39 accommodates a matching device configured to match the impedance at the high frequency power source 38 side with the impedance at the load side mainly such as, for example, the electrode, the plasma, and the processing container 12, and a blocking condenser configured to generate self bias is included in the matching device. Also, at the time of plasma processing, a bias voltage to the holding unit 14 may be supplied or not as desired.

The holding unit 14 may hold the substrate W thereon by an electrostatic chuck (not illustrated). The holding unit 14 includes a temperature control mechanism 33 such as, for example, a heater (not illustrated) for heating, provided therewithin, and may be set to a desired temperature by the temperature control mechanism 33. The holding unit 14 is supported by an insulative cylindrical support 31 that extends vertically upwardly from the lower side of the bottom section 21. The exhausting hole 23 is formed in the center of the bottom section 21 of the processing container 12 so that the cylindrical support 31 penetrates the exhausting hole 23. An exhaust device (not illustrated) is connected at the lower side of the exhausting hole 23 formed in a ring shape via an exhaust tube (not illustrated). The exhaust device includes a vacuum pump such as, for example, a turbo molecular pump. The inside of the processing container 12 may be decompressed to a predetermined pressure by the exhaust device.

The plasma generating mechanism 19 includes a microwave generator 41a which is provided outside of the processing container 12 and configured to generate a microwave for plasma excitation. The plasma generating mechanism 19 includes the dielectric window 16 which is disposed at the top of the processing container 12 at a position facing the holding unit 14 and which introduces the microwave generated by the microwave generator 41a into the processing container 12. The plasma generating mechanism 19 includes a slot antenna plate 17 which is disposed on the top of the dielectric window 16 and in which a plurality of slots radiating the microwave to the dielectric window 16 are formed. The plasma generating mechanism 19 includes a dielectric member 18 which is disposed on the top of the slot antenna plate 17 and configured to radially propagate the microwave introduced by a coaxial waveguide 36 to be descried later, thereby delaying the microwave.

The microwave generator 41a is connected to the top of the coaxial waveguide 36 configured to introduce the microwave, via a mode converter 34 and a rectangular waveguide 35. For example, a TE-mode microwave generated by the microwave generator 41a passes through the rectangular waveguide 35, is converted into a TEM-mode microwave by the mode converter 34, and propagates through the coaxial waveguide 36. A detailed configuration of the microwave generator 41a will be described later. Meanwhile, the rectangular waveguide 35 side to the microwave generator 41a becomes a load side to be described later.

The dielectric window 16 has a substantially disk shape and is formed of a dielectric material. A ring-shaped recess 37 which is recessed in a tapered shape or a recess which is recessed in a circular shape is formed at a portion of the bottom surface 28 of the dielectric window 16, so as to ensure that a standing wave may be easily generated by the introduced microwave. Due to the recess 37, plasma may be efficiently generated by a microwave at the bottom side of the dielectric window 16. Meanwhile, a specific material for the dielectric window 16 may be, for example, quartz or alumina.

The slot antenna plate 17 is formed in a disk shaped thin plate. The plurality of slots 20, as illustrated in FIG. 2, are formed so that two slots 20 are paired to be perpendicular to each other and spaced apart from each other at a predetermined interval. The paired slots 20 are formed in the circumferential direction at a predetermined interval. The plurality of pairs of slots 20 are formed at a predetermined interval in the radial direction.

The microwave generated by the microwave generator 41$a$ is propagated to the dielectric member 18 through the coaxial waveguide 36. The microwave radially spreads from the inside of the dielectric member 18 interposed between the slot antenna plate 17 and a cooling jacket 32 to the outside in the radial direction and then is radiated from the plurality of slots 20 formed in the slot antenna plate 17 to the dielectric window 16. The cooling jacket 32 has a circulation path 40 configured to circulate, for example, a coolant therein so that, for example, the slot antenna plate 17, the dielectric window 16 and the dielectric member 18 are cooled to perform a temperature control. The microwave, which has transmitted through the dielectric window 16, generates an electric field just below the dielectric window 16 to generate the plasma within the processing container 12.

When the microwave plasma is generated in the plasma processing apparatus 11, a so-called plasma generating region in which an electron temperature of plasma is relatively high (electron temperature Te≥1.5 eV) is formed just below the bottom surface 28 of the dielectric window 16, specifically, at a region positioned about several centimeters below the bottom surface 28 of the dielectric window 16. Then, at a region positioned below the plasma generating region, a so-called plasma diffusion region is formed in which the plasma generated in the plasma generating region is diffused. In the plasma diffusion region, an electron temperature of plasma is relatively low (electron temperature Te<1.5 eV), and a plasma processing is performed. Then, a so-called plasma damage is not given to the substrate W during the plasma processing and an electron density of plasma is high (electron density Ne>$1.5 \times 10^{12}$/cm$^3$). Thus, an efficient plasma processing may be performed.

The plasma generating mechanism 19 includes the dielectric window 16 configured to transmit a high frequency wave generated by a magnetron as a high-frequency oscillator to be described later into the processing container 12 and the slot antenna plate 17 in which the plurality of slots 20 are formed and which radiates the high frequency wave to the dielectric window 16. The plasma generated by the plasma generating mechanism 19 is generated by a radial line slot antenna.

Here, descriptions will be made on a specific configuration of the microwave generator 41$a$ included in the plasma generating mechanism 19 provided in the plasma processing apparatus 11 as configured as described above.

Figure 3:
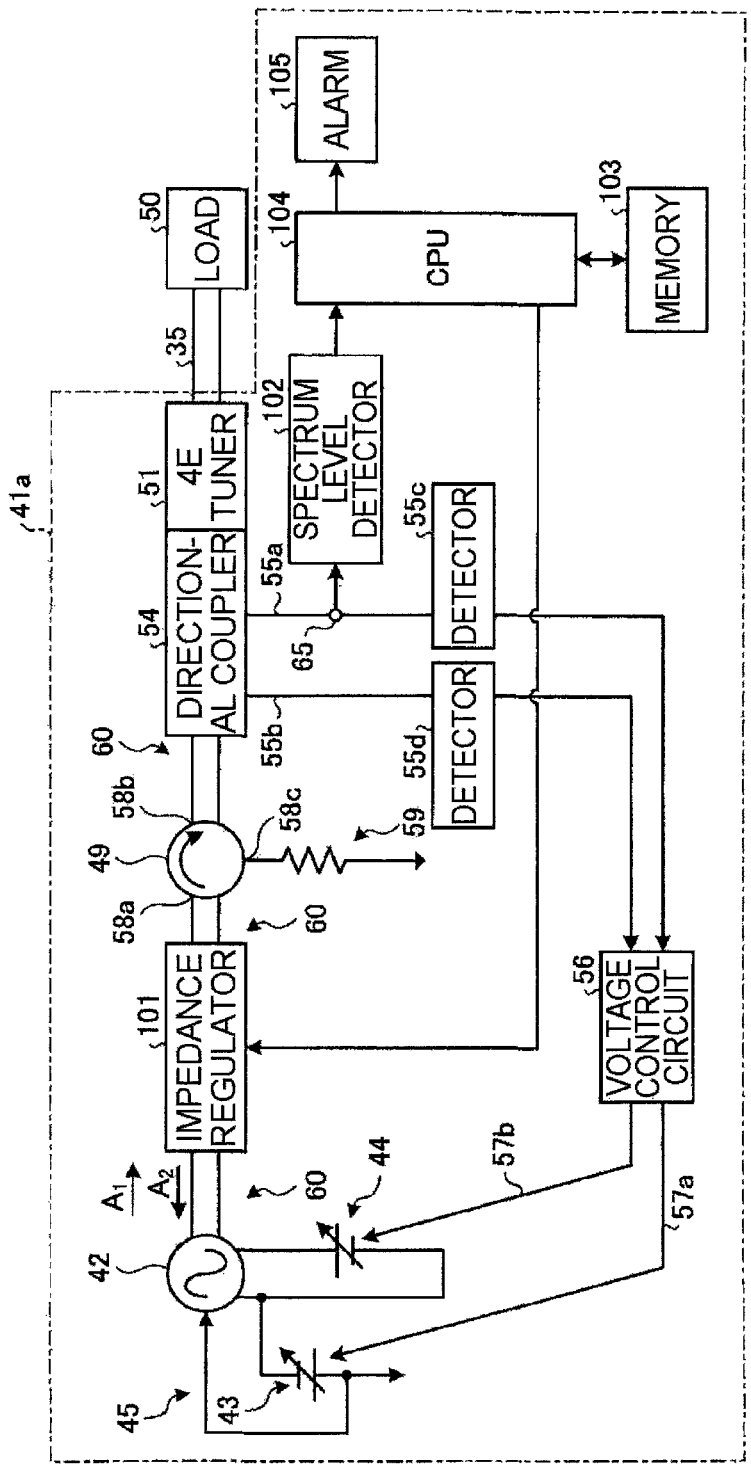
FIG. 3 is a block diagram illustrating the configuration of a microwave generator according to the first exemplary embodiment.
Figure 4:
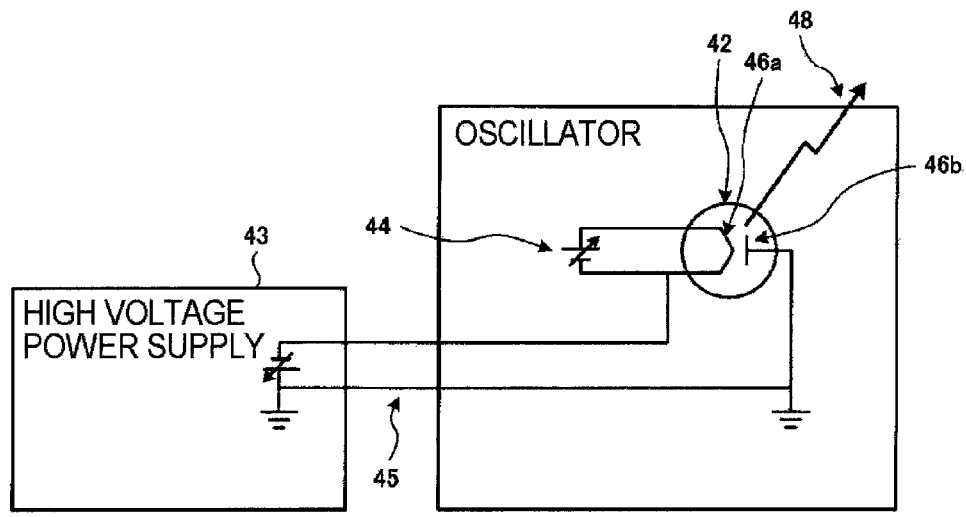
FIG. 4 is a schematic view illustrating the peripheral configuration of a magnetron included in the microwave generator.
Figure 5:
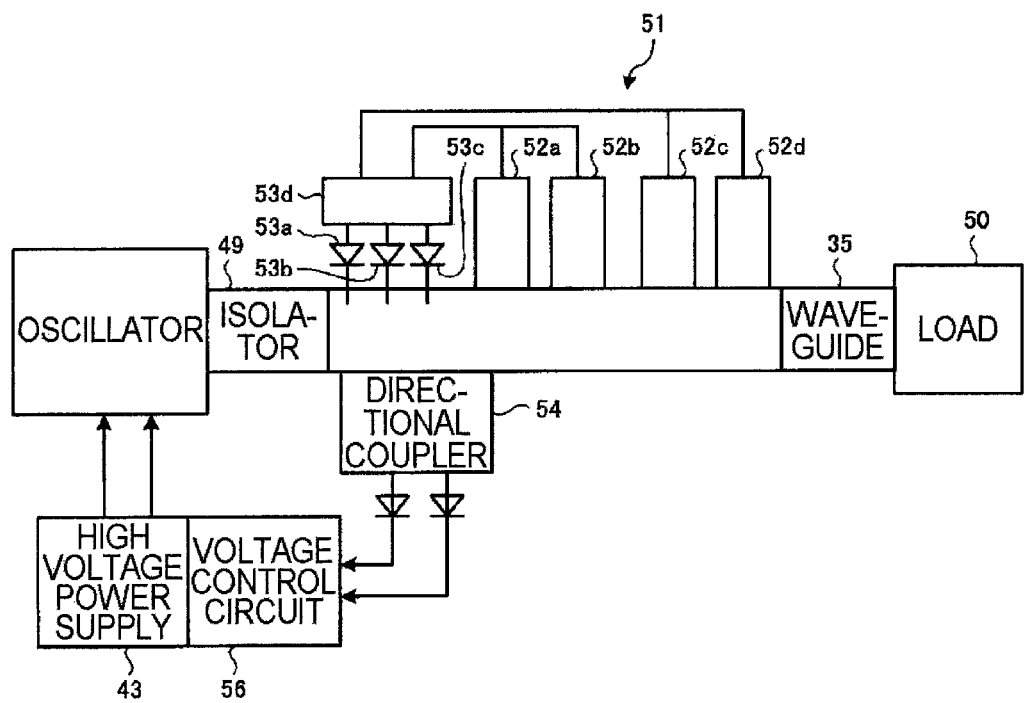
FIG. 5 is a schematic view illustrating the peripheral configuration of a 4E tuner included in the microwave generator.

FIG. 3 is a block diagram illustrating the configuration of the microwave generator 41$a$ according to the first exemplary embodiment. FIG. 4 is a schematic view illustrating the peripheral configuration of a magnetron (to be described later) included in the microwave generator 41$a$. FIG. 5 is a schematic view illustrating the peripheral configuration of a 4E tuner to be described later as a matching device, the 4E tuner being included in the microwave generator 41$a$.

Referring to FIGS. 3 to 5, the microwave generator 41$a$ includes a magnetron 42 as a high-frequency oscillator configured to oscillates a microwave as the high frequency wave, a high voltage power supply 43 configured to supply a voltage to the magnetron 42, and a filament power supply 44 configured to supply power to a filament which constitutes a cathode electrode 46$a$ when the high frequency wave is oscillated. An oscillation unit is constituted by the magnetron 42 and a launcher (not illustrated) configured to transmit a power of the microwave of the magnetron 42 to the waveguide. The microwave oscillated from the magnetron 42 travels in the direction of the arrow A1 in FIG. 3. Meanwhile, a reflected wave of the microwave travels in the direction indicated by the arrow A2 in FIG. 3, that is, in the reverse direction to the arrow A1.

A circuit 45 is formed between the magnetron 42 and the high voltage power supply 43. An anode current is supplied from the high voltage power supply 43 side to the magnetron 42 side through the circuit 45. Within the magnetron 42, a filament is inserted in the circuit 45. The cathode electrode 46$a$ constituted by the filament, and an anode electrode 46$b$ formed by being supplied with an anode current from the high voltage power supply 43 generates a microwave 48 to be output to the outside. Meanwhile, for example, the above described filament serving as a cathode side which constitutes the cathode electrode 46$a$, and an anode vane (not illustrated) which forms the anode electrode 46$b$ serving as an anode side are machined products manufactured by machining.

The microwave generator 41$a$ includes a directional coupler 54 to which the microwave oscillated by the magnetron 42 is connected via an isolator 49, and a 4E tuner 51 as a matching unit. The isolator 49 transmits a frequency signal from the magnetron 42 to the 4E tuner 51 side located at a load 50 side in one direction. The load 50 referred to herein is a member, such as the mode converter 34, located at a downstream side of, for example, the rectangular waveguide 35.

The 4E tuner 51 includes movable short-circuit units 52$a$, 52$b$, 52$c$, and 52$d$ and three probes 53$a$, 53$b$, and 53$c$. The movable short-circuit units 52$a$, 52$b$, 52$c$, and 52$d$ include four movable short-circuit plates (not illustrated) which are provided at intervals toward a traveling direction of the microwave. The three probes 53$a$, 53$b$, and 53$c$ are located at the magnetron 42 side in relation to the movable short-circuit unit 52$a$. The three probes 53$a$, 53$b$, and 53$c$ are provided to be spaced apart from each other at an interval of ⅛ of a fundamental frequency $\lambda$, that is, $\lambda/8$ toward the traveling direction of the microwave. An arithmetic circuit 53$d$ connected to the three probes 53$a$, 53$b$, and 53$c$ calculates projection amounts of tuning rods (not illustrated) corresponding to the three probes 53$a$ to 53$c$, respectively.

In the 4E tuner 51, the directional coupler 54 is provided at the magnetron 42 side in relation to the movable short-circuit unit 52$a$. The directional coupler 54 is a bi-directional coupler. Meanwhile, the directional coupler 54 may not face the three probes 53$a$, 53$b$, and 53$c$. By using the directional coupler 54, a power signal of the traveling wave which travels the inside of the waveguide through by a circuit 55$a$ is transmitted to a voltage control circuit 56 provided in the microwave generator 41$a$. Meanwhile, a power signal of the traveling wave transmitted by the circuit 55$a$ is detected as a traveling wave power by a detector 55$c$. By using the directional coupler 54, a power signal of the reflected wave which travels the inside of the waveguide by a circuit 55$b$ is transmitted to the voltage control circuit 56 provided in the microwave generator 41$a$. Meanwhile, a power signal of a reflected wave transmitted by the circuit 55$b$ is detected as a reflected wave power by a detector 55$d$. From the voltage control circuit 56, a control signal of the voltage supplied by the high voltage power supply 43 and a control signal of the voltage supplied to the filament power supply 44 are transmitted by using a control circuit 57$a$ and a control circuit 57$b$ so that the voltage of the high voltage power supply 43 is controlled. That is, the voltage control circuit 56 supplies a current to the high voltage power supply 43 and the filament power supply 44 at an appropriate voltage satisfying the specifications of the magnetron 42 in order for a set power to be the same as the traveling wave power detected by the directional coupler 54.

Meanwhile, the isolator 49 provided between the magnetron 42 and the 4E tuner 51 is configured such that one terminal of a circulator which is a passive element is used as a dummy load 59. That is, the isolator 49 is configured such that a first terminal 58*a* located at the magnetron 42 side is connected to the oscillation unit, a second terminal 58*b* located at the 4E tuner 51 side is connected to the 4E tuner 51, and a remaining third terminal 58*c* is connected to the dummy load 59. Accordingly, the isolator 49 may transmit a frequency signal from the magnetron 42 to the 4E tuner 51 located at the load 50 side in one direction.

The microwave generator 41*a*, as illustrated in FIG. 3, includes an impedance regulator 101, a spectrum level detector 102, a memory 103, a CPU (central processing unit) 104 and an alarm 105.

The impedance regulator 101 is provided in a waveguide 60 at the rear side of the magnetron 42 to adjust impedance to be applied to the magnetron 42. Specifically, the impedance regulator 101 includes a waveguide, and at least one metal rod (stub) which projects into the waveguide from the wall of the waveguide, and adjusts the impedance to be applied to the magnetron 42 by changing the projection amount of the stub projecting into the waveguide. For example, the impedance regulator 101 adjusts the impedance to be a specified value (a default value) in which when a wavelength of a standing wave within the waveguide is $\lambda g$, a voltage standing wave ratio (VSWR) is 1.5, and a phase of the standing wave is $0.4 \lambda g$. The impedance to be adjusted by the impedance regulator 101 is controlled by the CPU 104 to be described later. That is, the impedance regulator 101 adjusts the impedance to be applied to the magnetron 42 by increasing or decreasing the projection amount of the stub by using a control value of the impedance changed by the CPU 104.

The spectrum level detector 102 receives an input of a power signal of a traveling wave branched off from a junction 65 from the circuit 55*a*. The spectrum level detector 102 detects a spectrum level of a center frequency component of the microwave (hereinafter, referred to as "a fundamental wave") oscillated by the magnetron 42, and a spectrum level of a peripheral frequency component present at both ends of a predetermined frequency band centered around the center frequency of the fundamental wave, from the power signal of the traveling wave. The spectrum level detector 102 may detect spectrum levels of a plurality of peripheral frequency components present at both ends of each of a plurality of frequency bands around the center frequency of the fundamental wave. The spectrum level detector 102 outputs a value of the spectrum level of the center frequency component of the fundamental wave and a value of the spectrum level of the peripheral frequency component, as a detection result, to the CPU 104.

The memory 103 stores a predetermined threshold value $\Delta S1$ used for determining an abnormal oscillation of the magnetron 42. The threshold value $\Delta S1$ may be one predetermined value, or a plurality of different values. When the threshold value $\Delta S1$ is the plurality of different values, the memory 103 may store a first threshold value $\Delta S1$-1, and a second threshold value $\Delta S1$-2 greater than the first threshold value $\Delta S1$-1, as the threshold value $\Delta S1$.

The CPU 104 changes the impedance to be adjusted by the impedance regulator 101 (hereinafter, properly referred to as "impedance"). The CPU 104 determines the abnormal oscillation of the magnetron 42 based on the center frequency component of the fundamental wave oscillated by the magnetron 42 and the peripheral frequency component present at both ends of the predetermined frequency band centered around the center frequency of the fundamental wave, in a state where the impedance is changed. The abnormal oscillation of the magnetron 42 refers to a phenomenon in which the waveform of the microwave oscillated by the magnetron 42 is disturbed.

Figure 6:
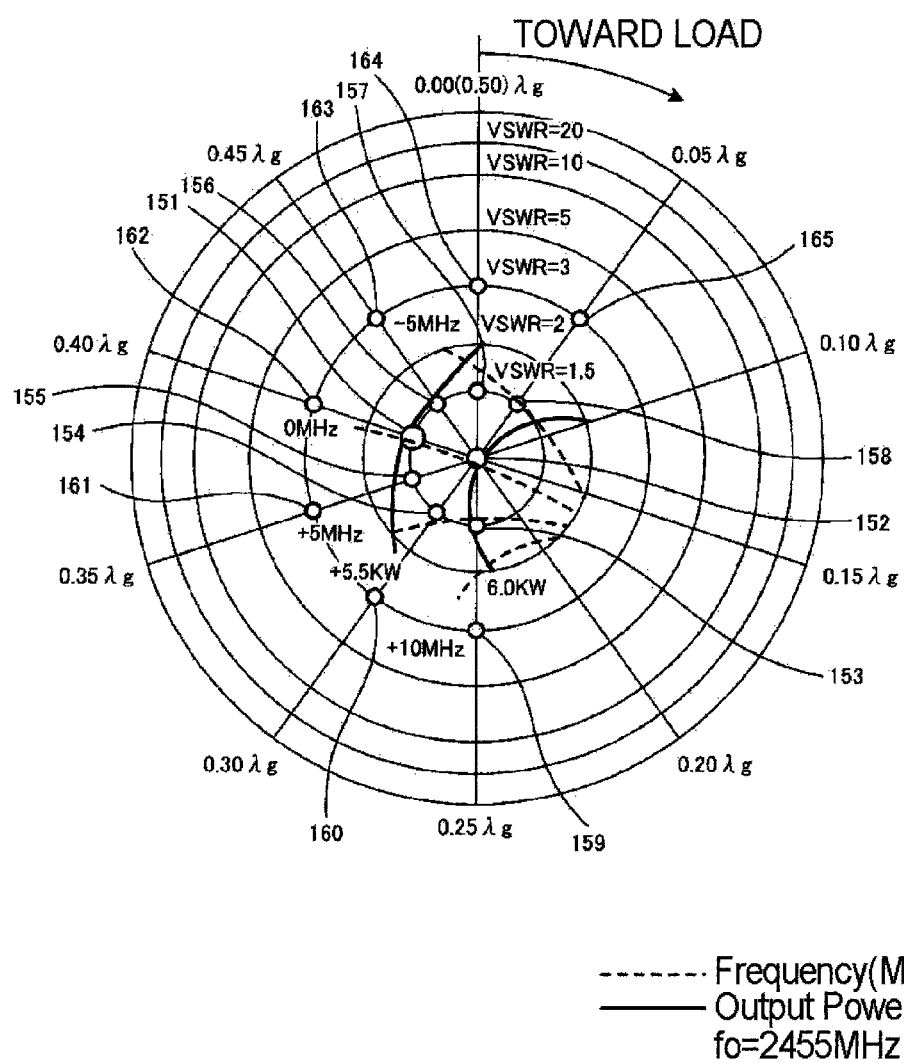
FIG. 6 is a Rieke diagram illustrating operating characteristics of a magnetron in the first exemplary embodiment.

Here, descriptions will be made on the relationship between a change of impedance, and an abnormal oscillation of the magnetron 42. FIG. 6 is a Rieke diagram illustrating operating characteristics of a magnetron in the first exemplary embodiment. FIGS. 7 to 10 are views illustrating examples of measurements of an abnormal oscillation of a magnetron when impedance of an impedance regulator is changed in the first exemplary embodiment. The Rieke diagram illustrated in FIG. 6 is a diagram in which an output power and an oscillation frequency of the magnetron 42 are displayed by contour lines on an impedance diagram represented by polar coordinates. In FIG. 6, the coordinate in the radial direction indicates a VSWR, and the coordinate in the circumferential direction indicates a phase of a standing wave.

In FIG. 6, the point 151 indicates an operating point of the magnetron 42 when the impedance is adjusted to be a specified value (a default value) (VSWR: 1.5, phase of standing wave: $0.4 \lambda g$). The point 152 indicates an operating point of the magnetron 42 when the impedance is changed to be a change value (VSWR: 1.0) from the specified value. The point 153 indicates an operating point of the magnetron 42 when the impedance is changed to be a change value (VSWR: 1.5, phase of standing wave: $0.25 \lambda g$) from the specified value. The point 154 indicates an operating point of the magnetron 42 when the impedance is changed to be a change value (VSWR: 1.5, phase of standing wave: $0.30 \lambda g$) from the specified value. The point 155 indicates an operating point of the magnetron 42 when the impedance is changed to be a change value (VSWR: 1.5, phase of standing wave: $0.35 \lambda g$) from the specified value. The point 156 indicates an operating point of the magnetron 42 when the impedance is changed to be a change value (VSWR: 1.5, phase of standing wave: $0.45 \lambda g$) from the specified value. The point 157 indicates an operating point of the magnetron 42 when the impedance is changed to be a change value (VSWR: 1.5, phase of standing wave: $0.00 (0.50) \lambda g$) from the specified value. The point 158 indicates an operating point of the magnetron 42 when the impedance is changed to be a change value (VSWR: 1.5, phase of standing wave: $0.05 \lambda g$) from the specified value.

In FIG. 6, the point 159 indicates an operating point of the magnetron 42 when the impedance is changed to be a change value (VSWR: 3.0, phase of standing wave: $0.25 \lambda g$) from the specified value. The point 160 indicates an operating point of the magnetron 42 when the impedance is changed to be a change value (VSWR: 3.0, phase of standing wave: $0.30 \lambda g$) from the specified value. The point 161 indicates an operating point of the magnetron 42 when the impedance is changed to be a change value (VSWR: 3.0, phase of standing wave: $0.35 \lambda g$) from the specified value. The point 162 indicates an operating point of the magnetron 42 when the impedance is changed to be a change value (VSWR: 3.0, phase of standing wave: $0.40 \lambda g$) from the specified value. The point 163 indicates an operating point of the magnetron 42 when the impedance is changed to be a change value (VSWR: 3.0, phase of standing wave: $0.45 \lambda g$) from the specified value. The point 164 indicates an operating point of the magnetron 42 when the impedance is changed to be a change value (VSWR: 3.0, phase of standing wave: $0.00 (0.50) \lambda g$) from the specified value. The point 165 indicates an operating point of the magnetron 42 when the impedance is changed to be a change value (VSWR: 3.0, phase of standing wave: $0.05 \lambda g$) from the specified value.

In the exemplary measurements illustrated in FIGS. 7 to 9, an abnormal oscillation was measured on each of three unused magnetrons A, B and C as an unused magnetron 42. In the exemplary measurement illustrated in FIG. 10, an abnormal oscillation was measured on a used-up magnetron D as a magnetron 42 which has been used for a predetermined period of time.

As illustrated in FIGS. 6 and 7, in the unused magnetron A, when impedance was changed from the specified value to a change value (VSWR: 1.5, phase of standing wave: 0.25 $\lambda$g), an abnormal oscillation occurred in an output power range from 1400 W to 1900 W.

As illustrated in FIGS. 6 and 8, in the unused magnetron B, when impedance was changed from the specified value to a change value (VSWR: 1.5, phase of standing wave: 0.25 $\lambda$g), an abnormal oscillation occurred in an output power range from 1900 W to 2700 W. Also, in the unused magnetron B, when impedance was changed from the specified value to a change value (VSWR: 3.0, phase of standing wave: 0.30 $\lambda$g), an abnormal oscillation occurred in an output power range from 1200 W to 1600 W. Also, in the unused magnetron B, when impedance was changed from the specified value to a change value (VSWR: 3.0, phase of standing wave: 0.25 $\lambda$g), an abnormal oscillation occurred in an output power range from 1500 W to 2100 W.

As illustrated in FIGS. 6 and 9, in the unused magnetron C, when impedance was changed from the specified value to a change value (VSWR: 1.5, phase of standing wave: 0.25 $\lambda$g), an abnormal oscillation occurred in an output power range from 2000 W to 2800 W. Also, in the unused magnetron C, when impedance was changed from the specified value to a change value (VSWR: 3.0, phase of standing wave: 0.35 $\lambda$g), an abnormal oscillation occurred in an output power range from 1600 W to 1900 W. Also, in the unused magnetron C, when impedance was changed from the specified value to a change value (VSWR: 3.0, phase of standing wave: 0.30 $\lambda$g), an abnormal oscillation occurred in an output power range from 1600 W to 2300 W. Also, in the unused magnetron C, when impedance was changed from the specified value to a change value (VSWR: 3.0, phase of standing wave: 0.25 $\lambda$g), an abnormal oscillation occurred in an output power range from 2600 W to 2900 W.

As illustrated in FIGS. 6 and 10, in the used-up magnetron D, when impedance was changed from the specified value to a change value (VSWR: 1.0), an abnormal oscillation occurred in an output power range from 1600 W to 2700 W. Also, in the used-up magnetron D, when impedance was changed from the specified value to a change value (VSWR: 1.5, phase of standing wave: 0.05 $\lambda$g), an abnormal oscillation occurred in an output power range from 2100 W to 2300 W. Also, in the used-up magnetron D, when impedance was changed from the specified value to a change value (VSWR: 1.5, phase of standing wave: 0.30 $\lambda$g), an abnormal oscillation occurred in an output power range from 2100 W to 2300 W. Also, in the used-up magnetron D, when impedance was changed from the specified value to a change value (VSWR: 1.5, phase of standing wave: 0.25 $\lambda$g), an abnormal oscillation occurred in an output power range from 1400 W to 2600 W. Also, in the used-up magnetron D, when impedance was changed from the specified value to a change value (VSWR: 3.0, phase of standing wave: 0.50 $\lambda$g), an abnormal oscillation occurred in an output power range from 1400 W to 1900 W. Also, in the used-up magnetron D, when impedance was changed from the specified value to a change value (VSWR: 3.0, phase of standing wave: 0.45 $\lambda$g), an abnormal oscillation occurred in an output power range from 1100 W to 1800 W. Also, in the used-up magnetron D, when impedance was changed from the specified value to a change value (VSWR: 3.0, phase of standing wave: 0.40 $\lambda$g), an abnormal oscillation occurred in an output power range from 800 W to 1800 W. Also, in the used-up magnetron D, when impedance was changed from the specified value to a change value (VSWR: 3.0, phase of standing wave: 0.35 $\lambda$g), an abnormal oscillation occurred in an output power range from 900 W to 2000 W. Also, in the used-up magnetron D, when impedance was changed from the specified value to a change value (VSWR: 3.0, phase of standing wave: 0.30 $\lambda$g), an abnormal oscillation occurred in an output power range from 1200 W to 2300 W. Also, in the used-up magnetron D, when impedance was changed from the specified value to a change value (VSWR: 3.0, phase of standing wave: 0.25 $\lambda$g), an abnormal oscillation occurred in an output power range from 2200 W to 2300 W.

As described above, regardless of whether the magnetron 42 is used up or not, when the impedance to be adjusted by the impedance regulator 101 is changed from the specified value, the frequency of occurrence of the abnormal oscillation of the magnetron 42 increased as compared to when the impedance is not changed. Also, when the magnetron 42 is used up, as compared to when the magnetron 42 is unused, the frequency of occurrence of the abnormal oscillation of the magnetron 42 increased. That is, determining the abnormal oscillation of the magnetron 42 in a state where the impedance is changed from the specified value corresponds to predicting occurrence of the abnormal oscillation of the magnetron 42 with the elapse of used time. Therefore, in order to predict the abnormal oscillation of the magnetron 42 with the elapse of used time, the CPU 104 of the present exemplary embodiment changes the impedance to be adjusted by the impedance regulator 101 and determines the abnormal oscillation of the magnetron 42 in a state where the impedance is changed. The CPU 104 is an exemplary determining unit.

Hereinafter, detailed descriptions will be made on a determination processing of the CPU 104 on the abnormal oscillation of the magnetron 42. The CPU 104 changes impedance to be adjusted by the impedance regulator 101, and acquires a value of a spectrum level of a center frequency component of a fundamental wave from the spectrum level detector 102, in a state where impedance is changed. The CPU 104 acquires a value of a spectrum level of a peripheral frequency component of the fundamental wave from the spectrum level detector 102, in a state where impedance is changed. The CPU 104 acquires a predetermined threshold value $\Delta S1$ to be used for determining the abnormal oscillation of the magnetron 42 from the memory 103. The CPU 104 calculates a difference between the value of the spectrum level of the center frequency component of the fundamental wave and the value of the spectrum level of the peripheral frequency component. The CPU 104 determines whether the calculated value of the difference is not greater than the threshold value $\Delta S1$. When the abnormal oscillation of the magnetron 42 occurs, a waveform disturbance of a microwave from the magnetron 42 occurs. Thus, the spectrum level of the center frequency component of the fundamental wave and the spectrum level of the peripheral frequency component of the fundamental wave come close to each other. The degree of the approach of the spectrum levels increases as the degree of the waveform disturbance of the microwave increases. In order to determine the degree of the approach of the spectrum levels, the CPU 104 determines whether the value of the difference between the spectrum levels is not greater than the threshold value $\Delta S1$.

When the calculated value of the difference is greater than the threshold value $\Delta S1$, the CPU 104 determines that the abnormal oscillation of the magnetron 42 has not occurred because the degree of the approach of the spectrum levels is relatively small. Meanwhile, when the calculated value of the difference is not greater than the threshold value ΔS1, the CPU 104 determines that the abnormal oscillation of the magnetron 42 has occurred because the degree of the approach of the spectrum levels is relatively large. The CPU 104 outputs the determination result to the alarm 105.

The CPU 104 performs the following processing when values of spectrum levels of a plurality of peripheral frequency components present at both ends of each of a plurality of frequency bands around the center frequency of the fundamental wave are acquired from the spectrum level detector 102, in a state where impedance is changed. That is, the CPU 104 acquires a first threshold value ΔS1-1 and a second threshold value ΔS1-2 greater than the first threshold value ΔS1-1, as a threshold value ΔS1 to be used for determining the abnormal oscillation of the magnetron 42, from the memory 103. The CPU 104 calculates a first difference between the value of the spectrum level of the center frequency component of the fundamental wave and the value of the spectrum level of one of the plurality of peripheral frequency components. The CPU 104 calculates a second difference between the value of the spectrum level of the center frequency component of the fundamental wave and the value of the spectrum level of another peripheral frequency component. The CPU 104 determines whether the calculated value of the first difference is not greater than the first threshold value ΔS1-1, and the value of the second difference is not greater than the second threshold value ΔS1-2.

When the value of the first difference is greater than the first threshold value ΔS1-1, or the value of the second difference is greater than the second threshold value ΔS1-2, the CPU 104 determines that the abnormal oscillation of the magnetron 42 has not occurred. Meanwhile, when the value of the first difference is not greater than the first threshold value ΔS1-1 and the value of the second difference is not greater than the second threshold value ΔS1-2, the CPU 104 determines that the abnormal oscillation of the magnetron 42 has occurred. The CPU 104 outputs the determination result to the alarm 105.

The alarm 105 notifies the result determined by the CPU 104. For example, the alarm 105 notifies the determination result by using sound, light, or vibration.

Figure 11:
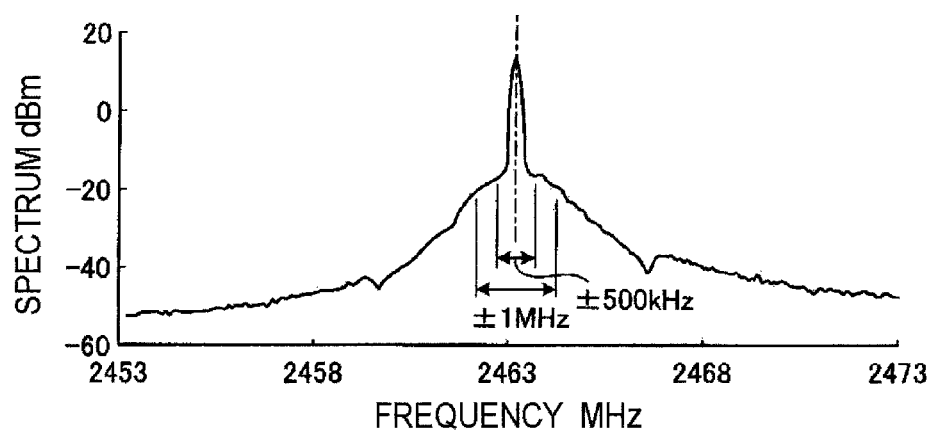
FIG. 11 is a view illustrating a frequency characteristic of a magnetron before impedance is changed from a specified value.
Figure 12:
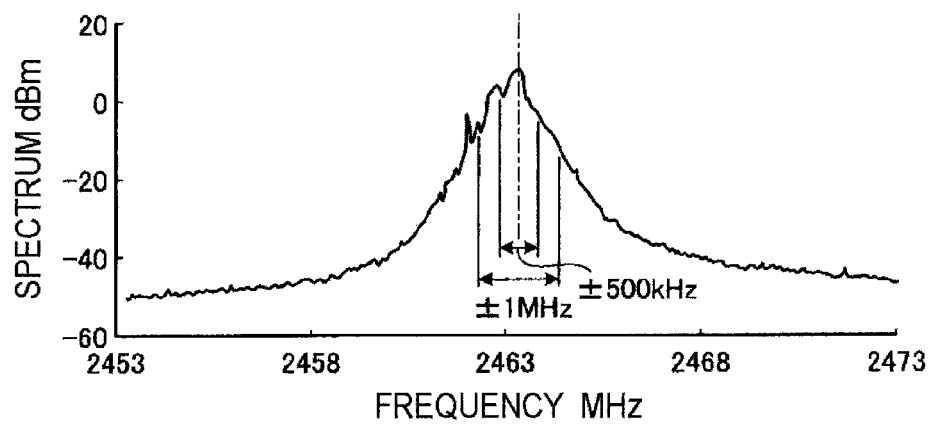
FIG. 12 is a view illustrating a frequency characteristic of a magnetron after impedance is changed from a specified value.

Here, descriptions will be made on an exemplary determination processing of the CPU 104 on the abnormal oscillation of the magnetron 42. FIG. 11 is a view illustrating a frequency characteristic of a magnetron before impedance is changed from a specified value. FIG. 12 is a view illustrating a frequency characteristic of a magnetron after impedance is changed from a specified value. In FIGS. 11 and 12, a horizontal axis refers to a frequency (MHz), and a vertical axis refers to a spectrum level (dBm). In both FIGS. 11 and 12, the output power of the magnetron 42 is assumed to be 1600 (W). In FIG. 11, the impedance is set to a specified value (a default value) (VSWR: 1.5, phase of standing wave: 0.4 λg). In FIG. 12, the impedance is changed from the specified value to a change value (VSWR: 1.5, phase of standing wave: 0.3 λg).

As illustrated in FIG. 11, when the impedance was set to the specified value, the waveform of the microwave oscillated by the magnetron 42 was not disturbed, and the abnormal oscillation of the magnetron 42 did not occur. In this case, the value of a spectrum level of a center frequency component (2463.6 MHz) of the fundamental wave is "13" (dBm). The spectrum level of a peripheral frequency component (−500 kHz) present at one end of a frequency band ranging from −500 kHz to +500 kHz centered around the center frequency of the fundamental wave is "−18" (dBm). The spectrum level of a peripheral frequency component (+500 kHz) present at the other end of the frequency band ranging from −500 kHz to +500 kHz is "−18" (dBm). Accordingly, first differences between the value of the spectrum level of the center frequency component (2463.6 MHz) and the values of the spectrum levels of the peripheral frequency components (+500 kHz) are 31 and 31 (dBm). Further, the spectrum level of a peripheral frequency component (−1 MHz) present at one end of a frequency band ranging from −1 MHz to +1 MHz centered around the center frequency of the fundamental wave is "−22" (dBm). The spectrum level of a peripheral frequency component (+1 MHz) present at the other end of the frequency band ranging from −1 MHz to +1 MHz is "−20" (dBm). Accordingly, second differences between the value of the spectrum level of the center frequency component (2463.6 MHz) and the values of the spectrum levels of the peripheral frequency components (±1 MHz) are 35 and 33 (dBm).

In contrast, as illustrated in FIG. 12, when the impedance was changed from the specified value, the waveform of the microwave oscillated by the magnetron 42 was disturbed, and the abnormal oscillation of the magnetron 42 occurred. In this case, the value of a spectrum level of a center frequency component (2463.6 MHz) of the fundamental wave is "9" (dBm). The spectrum level of a peripheral frequency component (−500 kHz) present at one end of a frequency band ranging from −500 kHz to +500 kHz centered around the center frequency of the fundamental wave is "4" (dBm). The spectrum level of a peripheral frequency component (+500 kHz) present at the other end of the frequency band ranging from −500 kHz to +500 kHz is "−4" (dBm). Accordingly, first differences between the value of the spectrum level of the center frequency component (2463.6 MHz) and the values of the spectrum levels of the peripheral frequency components (±500 kHz) are 5 and 13 (dBm). Further, the spectrum level of a peripheral frequency component (−1 MHz) present at one end of a frequency band ranging from −1 MHz to +1 MHz around the center frequency of the fundamental wave is "−8" (dBm). The spectrum level of a peripheral frequency component (+1 MHz) present at the other end of the frequency band ranging from −1 MHz to +1 MHz is "−12" (dBm). Accordingly, second differences between the value of the spectrum level of the center frequency component (2463.6 MHz) and the values of the spectrum levels of the peripheral frequency components (±1 MHz) are 17 and 21 (dBm).

As described above, when the impedance was changed from the specified value, as compared to when the impedance was set to the specified value, the first differences between the value of the spectrum level of the center frequency of the fundamental wave and the values of the spectrum levels of the peripheral frequency components (±500 kHz) were decreased. That is, when the abnormal oscillation of the magnetron 42 occurred, as compared to when the abnormal oscillation of the magnetron 42 did not occur, the first differences between the value of the spectrum level of the center frequency of the fundamental wave and the values of the spectrum levels of the peripheral frequency components (±500 kHz) were decreased. Also, when the impedance was changed from the specified value, as compared to when the impedance was set to the specified value, the second differences between the value of the spectrum level of the center frequency of the fundamental wave, and the values of the spectrum levels of the peripheral frequency components (±1 MHz) were decreased. That is, when the abnormal oscillation of the magnetron 42 occurred, as compared to when the abnormal oscillation of the magnetron 42 did not occur, the second differences between the value of the spectrum level of the center frequency of the fundamental wave, and the values of the spectrum levels of the peripheral frequency components (±1 MHz) were decreased. That is, in the example illustrated in FIG. 12, it is found that when the first difference is not greater than 20 (dBm) and the second difference is not greater than 30 (dBm), the abnormal oscillation of the magnetron 42 occurs. Accordingly, for example, the CPU 104 determines that the abnormal oscillation of the magnetron 42 has occurred when the value of the first difference is not greater than the first threshold value "20" (dBm) and the value of the second difference is not greater than the second threshold value "30" (dBm).

Figure 13:
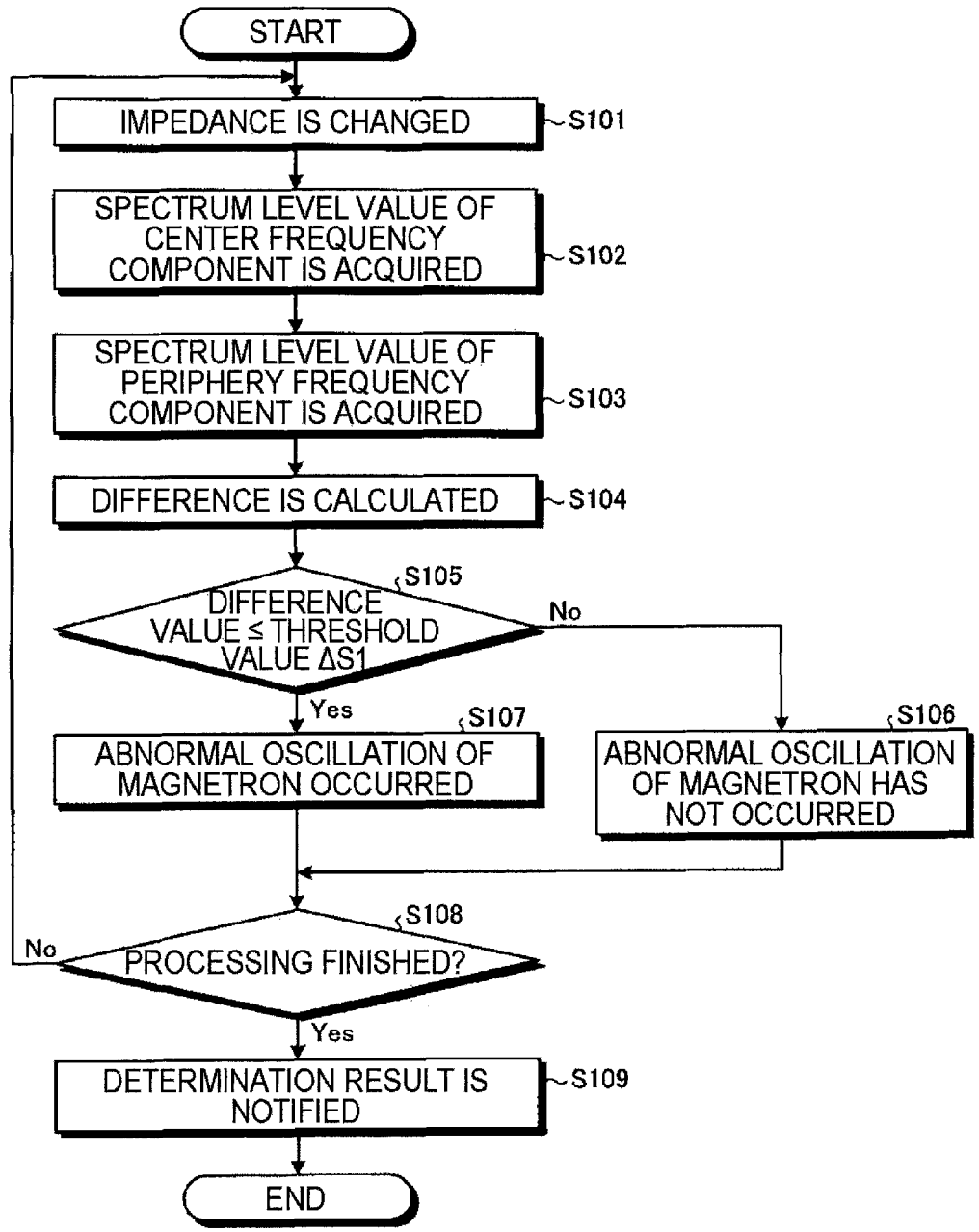
FIG. 13 is a flow chart illustrating an exemplary determination processing on the abnormal oscillation according to the first exemplary embodiment.

Subsequently, descriptions will be made on a determination processing on the abnormal oscillation using the plasma processing apparatus 11 according to the first exemplary embodiment. FIG. 13 is a flow chart illustrating an exemplary determination processing on the abnormal oscillation according to the first exemplary embodiment.

As illustrated in FIG. 13, the CPU 104 changes impedance to be adjusted by the impedance regulator 101 (step S101). The CPU 104 acquires a value of a spectrum level of a center frequency component of a fundamental wave from the spectrum level detector 102, in a state where impedance is changed (step S102). The CPU 104 acquires a value of a spectrum level of a peripheral frequency component from the spectrum level detector 102, in a state where the impedance is changed (step S103). The CPU 104 calculates a difference between the value of the spectrum level of the center frequency component of the fundamental wave and the value of the spectrum level of the peripheral frequency component (step S104).

Then, the CPU 104 determines whether the calculated value of the difference is not greater than the threshold value ΔS1 (step S105). When the calculated value of the difference is greater than the threshold value ΔS1 (step S105; No), the CPU 104 determines that the abnormal oscillation of the magnetron 42 has not occurred (step S106), and proceeds the processing to step S108.

When the calculated value of the difference is not greater than the threshold value ΔS1 (step S105; Yes), the CPU 104 determines that the abnormal oscillation of the magnetron 42 has occurred (step S107), and proceeds the processing to step S108.

When the processing is not finished (step S108; No), the CPU 104 proceeds the processing back to the step S101. Meanwhile, when the processing is finished (step S108; Yes), the CPU 104 notifies the determination result through the alarm 105 (step S109).

As described above, the plasma processing apparatus 11 of the first exemplary embodiment determines the abnormal oscillation of the magnetron 42 based on the center frequency component of the fundamental wave oscillated by the magnetron 42, and the peripheral frequency component, in a state where the impedance to be applied to the magnetron 42 is changed. Accordingly, the plasma processing apparatus 11 may predict the abnormal oscillation of the magnetron 42 with the elapse of used time, while implementing an environment in which the frequency of occurrence of the abnormal oscillation of the magnetron 42 is increased according to a change of the impedance. As a result, according to the first exemplary embodiment, the abnormal oscillation of the magnetron 42 may be properly determined.

Also, the plasma processing apparatus 11 of the first exemplary embodiment determines whether the value of the difference between the value of the spectrum level of the center frequency component of the fundamental wave and the value of the spectrum level of the peripheral frequency component in a state where the impedance is changed is not greater than the threshold value ΔS1. Then, the plasma processing apparatus 11 determines that the abnormal oscillation of the magnetron 42 has occurred when the value of the difference is not greater than ΔS1. As a result, according to the first exemplary embodiment, it is possible to accurately determine the occurrence of the abnormal oscillation of the magnetron 42 with the elapse of used time.

Second Exemplary Embodiment

In the first exemplary embodiment, the abnormal oscillation of the magnetron 42 is determined based on the center frequency component of the fundamental wave and the peripheral frequency component present at both ends of the predetermined frequency band centered around the center frequency of the fundamental wave, in a state where the impedance is changed. However, the abnormal oscillation of the magnetron 42 may be determined based on the center frequency component of the fundamental wave and the frequency component of a different frequency wave present outside of both ends of the predetermined frequency band centered around the center frequency of the fundamental wave, in a state where the impedance is changed. Accordingly, in the second exemplary embodiment, descriptions will be made on determination on the abnormal oscillation of the magnetron 42 based on the center frequency component of the fundamental wave, and the frequency component of a different frequency wave present outside of both ends of the predetermined frequency band centered around the center frequency of the fundamental wave, in a state where the impedance is changed. Meanwhile, in the following description, the same elements as those in the first exemplary embodiment are given the same numerals as those in the first exemplary embodiment, and descriptions thereof will be omitted.

Figure 14:
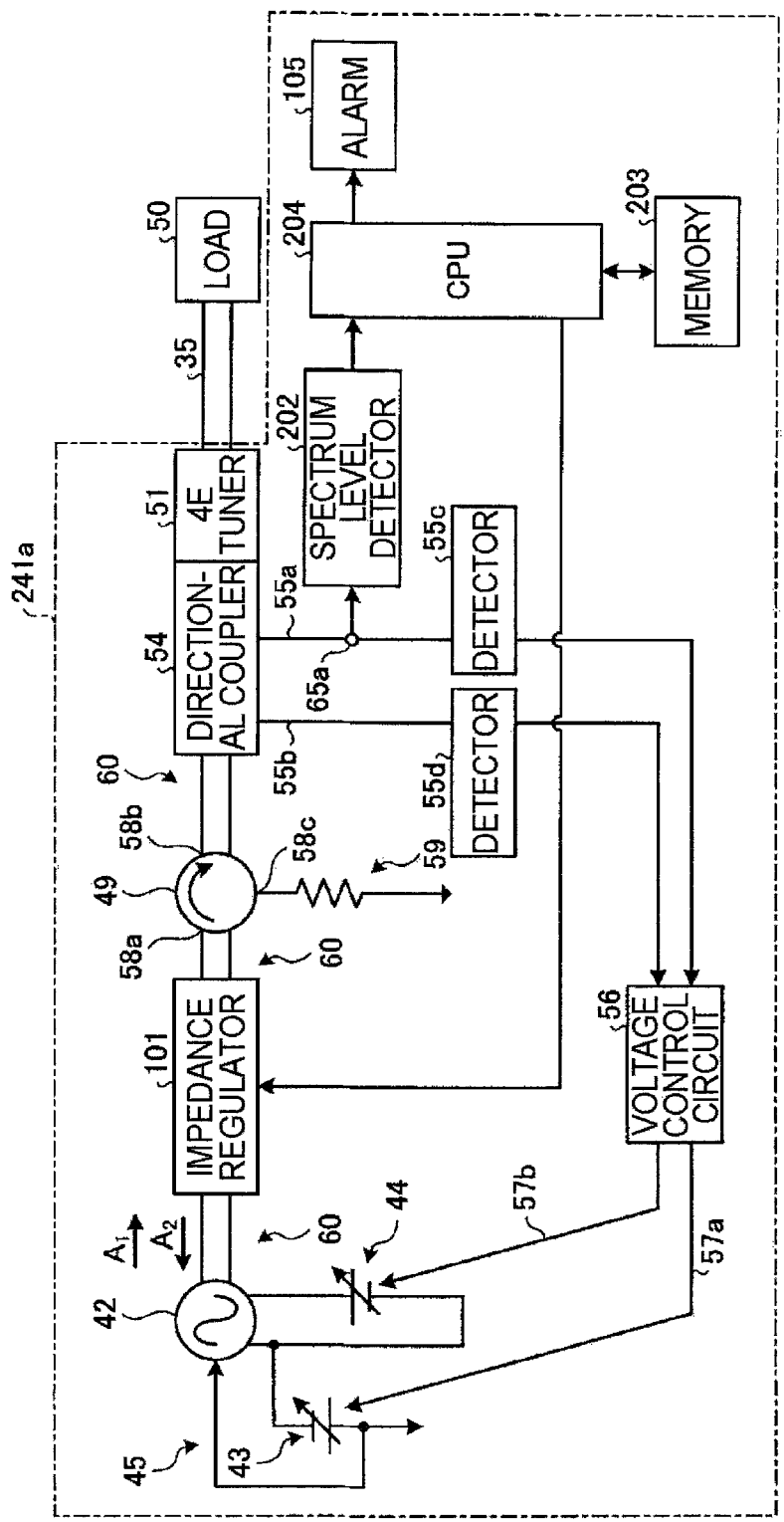
FIG. 14 is a block diagram illustrating the configuration of a microwave generator according to a second exemplary embodiment.

FIG. 14 is a block diagram illustrating the configuration of a microwave generator according to the second exemplary embodiment. A microwave generator 241a illustrated in FIG. 14 includes a spectrum level detector 202, a memory 203 and a CPU 204 instead of the spectrum level detector 102, the memory 103 and the CPU 104 of the microwave generator 41a as illustrated in FIG. 3.

The spectrum level detector 202 receives an input of a power signal of a traveling wave branched off from a junction 65a from the circuit 55a in the same manner as the spectrum level detector 102 illustrated in FIG. 3. The spectrum level detector 202 detects a spectrum level of a center frequency component of the fundamental wave oscillated by the magnetron 42, and a spectrum level of a peripheral frequency component present at both ends of a predetermined frequency band centered around the center frequency of the fundamental wave, from the power signal of the traveling wave. The spectrum level detector 202 may detect spectrum levels of a plurality of peripheral frequency components present at both ends of each of a plurality of frequency bands around the center frequency of the fundamental wave. The spectrum level detector 202 outputs a value of the spectrum level of the center frequency component of the fundamental wave, and a value of the spectrum level of the peripheral frequency component, as a detection result, to the CPU 204.

The spectrum level detector 202 also detects a spectrum level of a frequency component of a different frequency wave occurring outside of both ends of the predetermined frequency band centered around the center frequency of the fundamental wave, from the power signal of the traveling wave. The spectrum level detector 202 outputs a value of the spectrum level of the frequency component of the different frequency wave, as a detection result, to the CPU 204.

Here, the frequency component of the different frequency wave will be briefly described. The high frequency wave oscillated by the high-frequency oscillator has another frequency characteristic, such as a different frequency component not intended in design, so-called spurious emission. The different frequency component is included in the high frequency wave. The different frequency component tends to be increased as the high-frequency oscillator having a relativley higher frequency is used. The increase of the different frequency component causes a reflected wave in a waveguide and a matching unit where the high frequency wave oscillated by the high-frequency oscillator is propagated. When the reflected wave is caused, the effective power of the magnetron 42 or the impedance of load when the microwave is generated may be changed. As a result, the abnormal oscillation of the magnetron 42 is likely to occur. That is, the timing when the reflected wave starts to occur becomes a measure of the timing of so-called replacement of the magnetron 42.

The memory 203 stores predetermined threshold values $\Delta S1$ and $\Delta S2$ used for determining the abnormal oscillation of the magnetron 42. The threshold value $\Delta S1$ corresponds to a threshold value $\Delta S1$ of the first exemplary embodiment, and is a threshold value for determining the abnormal oscillation of the magnetron 42 which occurs around the center frequency of the fundamental wave. The threshold value $\Delta S2$ is a threshold value for determining the abnormal oscillation of the magnetron 42 which is caused by an increase of a different frequency component.

The CPU 204 changes the impedance to be adjusted by the impedance regulator 101 (hereinafter, properly referred to as "impedance") like CPU 104 illustrated in FIG. 3. The CPU 204 determines the abnormal oscillation of the magnetron 42 based on the center frequency component of the fundamental wave oscillated by the magnetron 42 and the peripheral frequency component present at both ends of the predetermined frequency band centered around the center frequency of the fundamental wave, in a state where the impedance is changed. Also, the CPU 204 determines the abnormal oscillation of the magnetron 42 based on the center frequency component of the fundamental wave oscillated by the magnetron 42 and the frequency component of the different frequency wave in a state where the impedance is changed.

Here, detailed descriptions will be made on a determination processing of the CPU 204 on the abnormal oscillation of the magnetron 42. The CPU 204 changes impedance to be adjusted by the impedance regulator 101 and acquires a value of a spectrum level of a center frequency component of a fundamental wave from the spectrum level detector 202, in a state where impedance is changed. The CPU 204 acquires a value of a spectrum level of a peripheral frequency component of the fundamental wave from the spectrum level detector 202, in a state where impedance is changed. The CPU 204 acquires a predetermined threshold value $\Delta S1$ to be used for determining the abnormal oscillation of the magnetron 42 from the memory 103. The CPU 204 calculates a difference between the value of the spectrum level of the center frequency component of the fundamental wave and the value of the spectrum level of the peripheral frequency component. The CPU 204 determines whether the calculated value of the difference is not greater than the threshold value $\Delta S1$. When the abnormal oscillation of the magnetron 42 occurs, a waveform disturbance of a microwave from the magnetron 42 occurs. Thus, the spectrum level of the center frequency component of the fundamental wave and the spectrum level of the peripheral frequency component of the fundamental wave come close to each other. The degree of the approach of the spectrum levels increases as the degree of the waveform disturbance of the microwave increases. In order to determine the degree of the approach of the spectrum levels, the CPU 204 determines whether the value of the difference between the spectrum levels is not greater than the threshold value $\Delta S1$.

Meanwhile, when the calculated value of the difference is not greater than the threshold value $\Delta S1$, the CPU 204 determines that the abnormal oscillation of the magnetron 42 has occurred because the degree of the approach of the spectrum levels is relatively large.

The CPU 204 performs the following processing when the calculated value of the difference is greater than the threshold value $\Delta S1$. That is, the CPU 204 acquires a value of a spectrum level of the frequency component of a different frequency wave from the spectrum level detector 202. The CPU 204 acquires a threshold value $\Delta S2$ to be used for determining the abnormal oscillation of the magnetron 42 from the memory 103, the abnormal oscillation being caused by an increase of the different frequency component. The CPU 204 calculates a difference between the value of the spectrum level of the center frequency component of the fundamental wave and the value of the spectrum level of the frequency component of the different frequency wave. Hereinafter, the difference between the value of the spectrum level of the center frequency component of the fundamental wave and the value of the spectrum level of the frequency component of the different frequency wave will be called "different frequency difference." The CPU 204 determines whether the calculated value of the different frequency difference is not greater than the threshold value $\Delta S2$. When the abnormal oscillation of the magnetron 42 occurs according to an increase of the different frequency component, a waveform disturbance of a microwave occurs. Thus, the spectrum level of the center frequency component of the fundamental wave and the spectrum level of the frequency component of the different frequency wave come close to each other. The degree of the approach of the spectrum levels increases as the degree of an increase of the different frequency component increases. In order to determine the degree of the approach of the spectrum levels, the CPU 204 determines whether the value of the different frequency difference is not greater than the threshold value $\Delta S2$.

When the value of the different frequency difference is greater than the threshold value $\Delta S2$, the CPU 204 determines that the abnormal oscillation of the magnetron 42 has not occurred because the degree of the approach of the spectrum levels is relatively small. Meanwhile, when the value of the different frequency difference is not greater than the threshold value $\Delta S2$, the CPU 204 determines that the abnormal oscillation of the magnetron 42 has occurred because the degree of the approach of the spectrum levels is relatively large. The CPU 204 outputs the determination result to the alarm 105.

Figure 15:
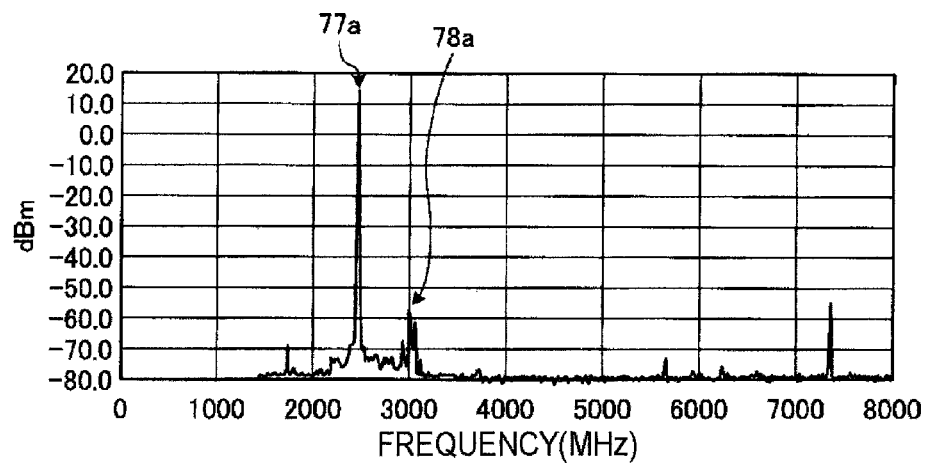
FIG. 15 is a graph illustrating a frequency at an initial state of use of a magnetron.
Figure 16:
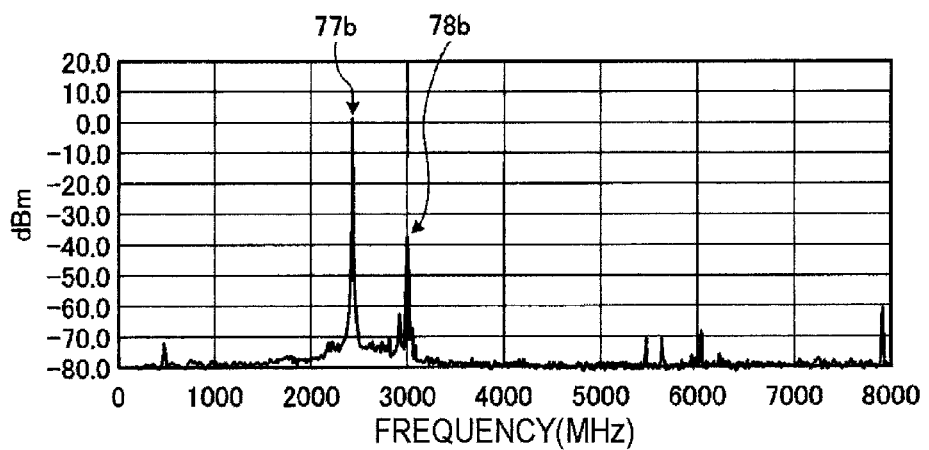
FIG. 16 is a graph illustrating a frequency after a magnetron is used for a long time.

Here, descriptions will be made on the relationship between the value of the different frequency difference and the threshold value $\Delta S2$. FIG. 15 is a graph illustrating a frequency at an initial state of use of the magnetron 42. FIG. 16 is a graph illustrating a frequency after the magnetron 42 is used for a long time. In FIGS. 15 and 16, a horizontal axis refers to a frequency (MHz), and a vertical axis refers to a spectrum level (dBm). Referring to FIGS. 15 and 16, a large spectrum 77a around 2450 MHz (2.45 GHz) indicates a center frequency component of a fundamental wave and a spectrum 78a around 3000 MHz (3 GHz) indicates a frequency component of a different frequency wave.

First, referring to FIG. 15, at the initial state of the use of the magnetron 42, the different frequency difference between the level of the spectrum 77a of the fundamental wave and the level of the spectrum 78a of the different frequency wave is relatively large. In FIG. 15, the level of the spectrum 77a of the fundamental wave is about 10.0 dBm, and the level of the spectrum 78a of the different frequency wave is about −60.0 dBm. The different frequency difference between the level of the spectrum 77a of the fundamental wave and the level of the spectrum 78a of the different frequency wave is about 70.0 dBm. However, referring to FIG. 16, after a long-term use, the different frequency difference between the level of the spectrum 77a of the fundamental wave and the level of the spectrum 78a of the different frequency wave is decreased. In FIG. 16, the level of the spectrum 77a of the fundamental wave is about 0.0 dBm, and the level of the spectrum 78a of the different frequency wave is about −40.0 dBm. The different frequency difference between the level of the spectrum 77a of the fundamental wave and the level of the spectrum 78a of the different frequency wave is about 40.0 dBm.

Figure 17:
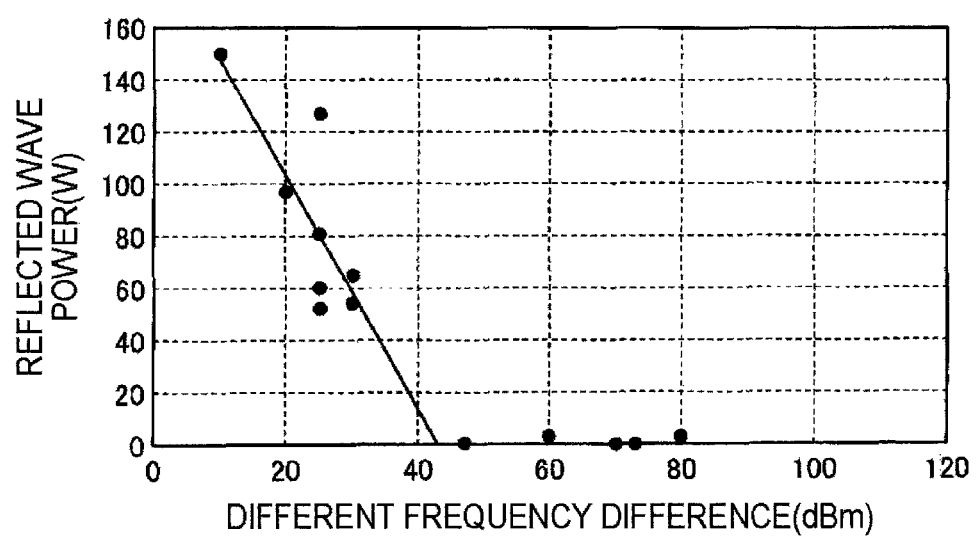
FIG. 17 is a graph illustrating the relationship between a different frequency difference and a reflected wave power.

FIG. 17 is a graph illustrating the relationship between the different frequency difference and the reflected wave power. Referring to FIG. 17, when the different frequency difference is 40.0 dBm or more, the value of the reflected wave power is 0 (W). That is, no reflected wave power is generated. In contrast, when the different frequency difference is less than 40.0 dBm, a reflected wave power is generated. Here, it can be found that when the different frequency difference is 40 dBm or more, no reflected wave power is generated. Accordingly, in the present exemplary embodiment, 40.0 dBm may be set as the threshold value ΔS2. Then, at a timing when the different frequency difference becomes less than 40.0 dBm, for example, an occurrence of an alarm sound is notified by the alarm 105. The timing becomes a measure of the timing of replacement of the magnetron 42. If the substrate W is being subjected to a plasma processing when the notification is performed by the alarm 105, the magnetron 42 only has to be replaced after the plasma processing is finished. Before the substrate W is subjected to a plasma processing, the magnetron 42 may be replaced before the plasma processing is performed.

That is, in the plasma processing apparatus 11, the status of the magnetron 42 is determined by the CPU 204, and the determination result is notified by the alarm 105 as a notification unit. Thus, the timing of replacement of the magnetron 42 may be planned. Then, it is possible to avoid a situation in which replacement of the magnetron 42 is required during the plasma processing. Accordingly, according to the plasma processing apparatus 11, the plasma processing may be efficiently performed.

Meanwhile, in this case, in a determination mechanism, it is not necessary to enter a particular value as an initial value. That is, it is possible to plan the replacement timing of the magnetron 42 by using the detected components of the fundamental wave and the different frequency wave. Accordingly, convenience is good.

In this case, a part of a frequency signal oscillated by the magnetron 42 is branched off from a junction 65a to be input. Thus, the handling property of the frequency signal branched off from the waveguide 60 may be improved.

Referring to FIG. 17, it can also be found that there is a tendency that as the difference between spectrum levels decreases, a larger reflected wave power is generated. Accordingly, in view of a balance with the magnitude of the reflected wave power, the threshold value may be set as another value so as to plan the replacement timing of the magnetron 42.

Figure 18:
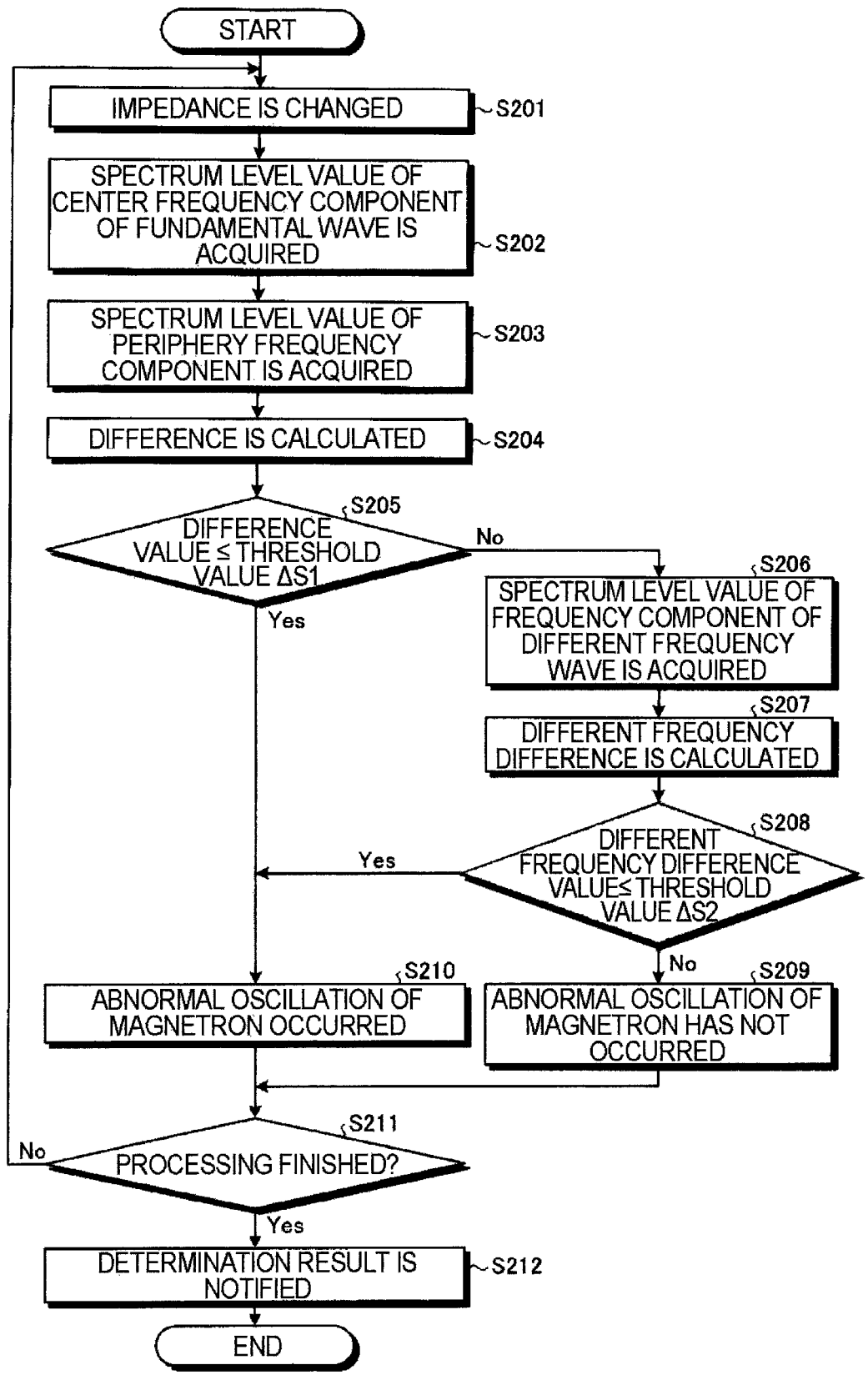
FIG. 18 is a flow chart illustrating an exemplary determination processing on the abnormal oscillation according to the second exemplary embodiment.

Subsequently, descriptions will be made on a determination processing on the abnormal oscillation using the plasma processing apparatus 11 according to the second exemplary embodiment. FIG. 18 is a flow chart illustrating an exemplary determination processing on the abnormal oscillation according to the second exemplary embodiment. Steps S201 to S204 illustrated in FIG. 18 correspond to steps S101 to S104 illustrated in FIG. 13, respectively, and thus a detailed description thereof will be omitted.

As illustrated in FIG. 18, after the value of the difference between the value of the spectrum level of the center frequency component of the fundamental wave and the value of the spectrum level of the peripheral frequency component is calculated in step S204, the CPU 204 determines whether the calculated value is not greater than the threshold value ΔS1 (step S205).

When it is determined that the calculated value of the difference is greater than the threshold value ΔS1 (step S205; No), the CPU 204 acquires the value of the spectrum level of the frequency component of the different frequency wave from the spectrum level detector 202 (step S206). The CPU 204 calculates a different frequency difference which is a difference between the value of the spectrum level of the center frequency component of the fundamental wave and the value of the spectrum level of the frequency component of the different frequency wave (step S207). The CPU 204 determines whether the calculated value of the different frequency difference is not greater than the threshold value ΔS2 (step S208).

When it is determined that the value of the different frequency difference is greater than the threshold value ΔS2 (step S208; No), the CPU 204 determines that the abnormal oscillation of the magnetron 42 has not occurred (step S209), and proceeds the processing to step S211.

Meanwhile, when it is determined that the value of the difference calculated in step S204 is not greater than the threshold value ΔS1 (step S205; Yes), or the value of the different frequency difference is not greater than the threshold value ΔS2 (step S208; Yes), the CPU 204 determines that the abnormal oscillation of the magnetron 42 has occurred (step S210), and proceeds the processing to step S211.

When it is determined that the processing is not finished (step S211; No), the CPU 204 proceeds the processing back to step S201. Meanwhile, when the processing is finished (step S211; Yes), the CPU 204 notifies the determination result through the alarm 205 (step S212).

As described above, the plasma processing apparatus 11 of the second exemplary embodiment determines the abnormal oscillation of the magnetron 42 based on the center frequency component of the fundamental wave and the frequency component of the different frequency wave, in a state where the impedance is changed. As a result, the plasma processing apparatus 11 may accurately determine the abnormal oscillation of the magnetron 42 according to an increase of the different frequency component.

Other Exemplary Embodiments

The plasma processing apparatus of the first and second exemplary embodiments has been described, but the present disclosure is not limited thereto. Hereinafter, other exemplary embodiments will be described.

For example, in the first and second exemplary embodiments as described above, a CPU determines the abnormal oscillation of the magnetron 42, but the present disclosure is not limited thereto. For example, hardware such as, for example, a subtracting circuit and a comparator, may be allowed to serve a part of a determination function of the abnormal oscillation by the CPU.

Figure 19:
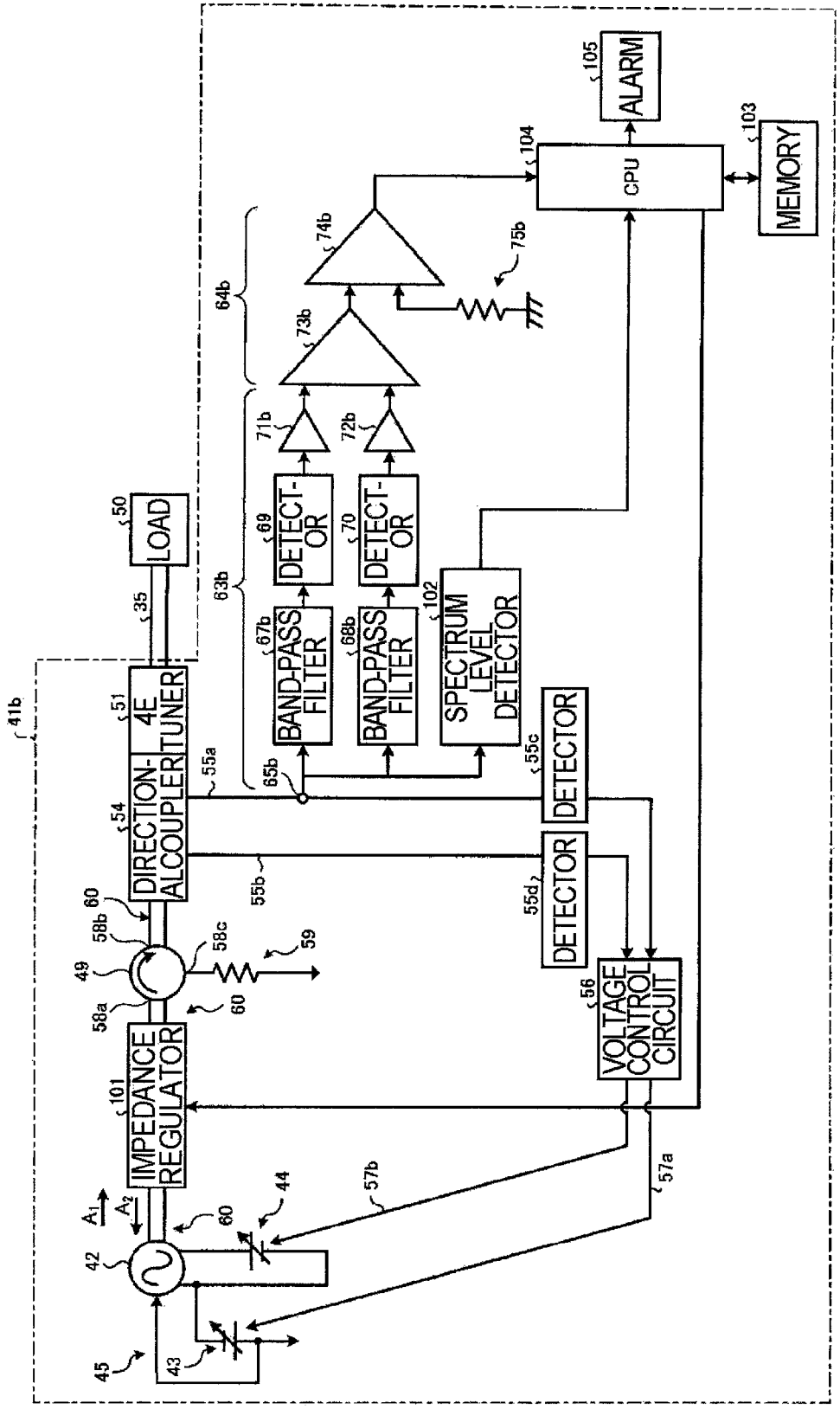
FIG. 19 is a block diagram illustrating a schematic configuration of a microwave generator provided in a plasma processing apparatus according to another exemplary embodiment.

FIG. 19 is a block diagram illustrating a schematic configuration of a microwave generator 41b provided in a plasma processing apparatus according to another exemplary embodiment. Meanwhile, in the following description, the same elements as those in the first exemplary embodiment are given the same numerals as those in the first exemplary embodiment, and descriptions thereof will be omitted. The microwave generator 41b illustrated in FIG. 19 includes a spectrum level detecting unit 63b configured to detect a spectrum level of a fundamental wave component and a spectrum level of a different frequency component, and a spectrum level comparing unit 64b configured to compare the value of the spectrum level of the fundamental wave component with the different frequency component which are detected by the spectrum level detecting unit 63b. The spectrum level detecting unit 63b includes a junction 65b provided in the middle of the circuit 55a leading from the directional coupler 54 to the detector 55c, a first band-pass filter 67b and a second band-pass filter 68b to which the input frequency signal branched off from the junction 65b is input, a first detector 69b configured to detect the frequency signal which has passed through the first band-pass filter 67b, a second detector 70b configured to detect the frequency signal which has passed through the second band-pass filter 68b, a first gain adjusting amplifier 71b configured to amplify the frequency signal detected by the first detector 69b, and a second gain adjusting amplifier 72b configured to amplify the frequency signal detected by the second detector 70b. The spectrum level comparing unit 64b includes a subtracting circuit 73b configured to calculate a difference between the frequency signal amplified by the first gain adjusting amplifier 71b, and the frequency signal amplified by the second gain adjusting amplifier 72b, a comparator 74b configured to compare the value of the difference calculated by the subtracting circuit 73b with a threshold value to be set as a predetermined value, and a threshold value adjusting unit 75b configured to adjust the threshold value, which is a target value, to be compared by the comparator 74b.

The first band-pass filter 67b performs filtering that allows only a frequency band of a fundamental wave component to pass and removes other frequency bands. The first detector 69b detects the fundamental wave component which has passed through the first band-pass filter 67b. The fundamental wave component detected by the first detector 69b is amplified by the first gain adjusting amplifier 71b and input to the subtracting circuit 73b. The second band-pass filter 68b performs filtering that allows only a frequency band of a different frequency component to pass and removes other frequency bands. The second detector 70b detects the different frequency component which has passed through the second band-pass filter 68b. The different frequency component detected by the second detector 70b is amplified by the second gain adjusting amplifier 72b and input to the subtracting circuit 73b. The subtracting circuit 73b calculates a difference between the spectrum levels of the fundamental wave and the different frequency wave which are amplified, respectively. The calculated difference is input to the comparator 74b. The threshold value which is adjusted by the threshold value adjusting unit 75b and which corresponds to a target value to be compared with the difference is also input to the comparator 74b. The value of the difference is compared with the threshold value by the comparator 74b and the abnormal oscillation of the magnetron 42 is determined based on the comparison result. The determination result is input to the alarm 105 through the CPU 104, and notified.

According to the other exemplary embodiment as described above, hardware such as, for example, a subtracting circuit and a comparator is allowed to serve a part of a determination function of the abnormal oscillation by the CPU. Thus, it is possible to reduce the processing load caused by the determination processing of the abnormal oscillation of the magnetron 42.

Meanwhile, in the other exemplary embodiment as described above, the spectrum level comparing unit included in the microwave generator includes the subtracting circuit, the comparator, and the threshold value adjusting unit, but the present disclosure is not limited thereto. For example, an input analog data may be converted into a digital data to be used for a comparison by the spectrum level comparing unit.

Figure 20:
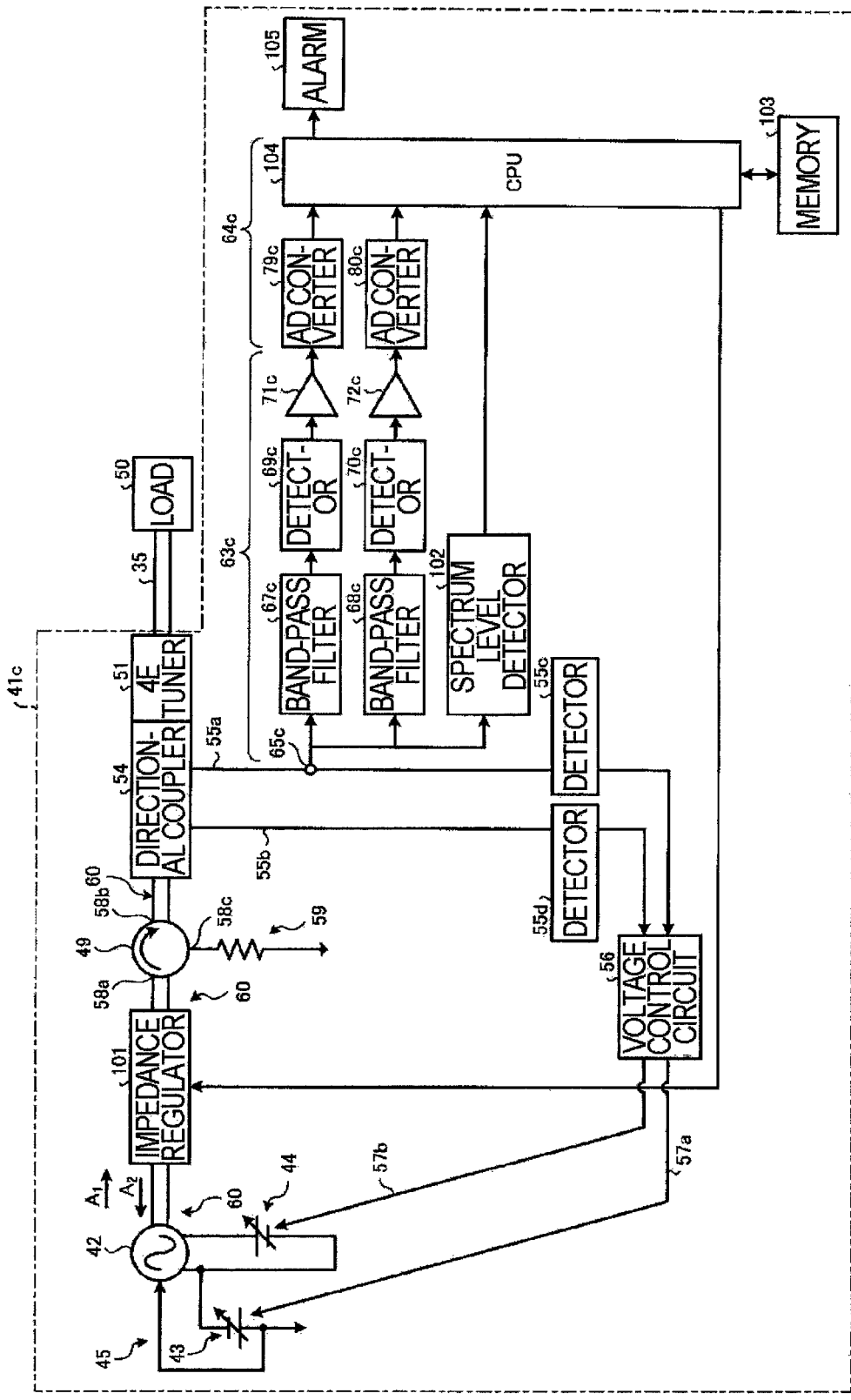
FIG. 20 is a block diagram illustrating a schematic configuration of a microwave generator provided in a plasma processing apparatus according to a further exemplary embodiment.

FIG. 20 is a block diagram illustrating a schematic configuration of a microwave generator 41c provided in a plasma processing apparatus in this case. Meanwhile, in the following description, the same elements as those in the first exemplary embodiment are given the same numerals as those in the first exemplary embodiment, and descriptions thereof will be omitted. The microwave generator 41c illustrated in FIG. 20 includes a spectrum level detecting unit 63c configured to detect a spectrum level of a fundamental wave component and a spectrum level of a different frequency component, and a spectrum level comparing unit 64c configured to compare the value of the spectrum level of the fundamental wave component with the different frequency component which are detected by the spectrum level detecting unit 63c. The spectrum level detecting unit 63c includes a junction 65c provided in the middle of the circuit 55a leading from the directional coupler 54 to the detector 55c, a first band-pass filter 67c and a second band-pass filter 68c to which the input frequency signal branched off from the junction 65c is input, a first detector 69c configured to detect the frequency signal which has passed through the first band-pass filter 67c, a second detector 70c configured to detect the frequency signal which has passed through the second band-pass filter 68c, a first gain adjusting amplifier 71c configured to amplify the frequency signal detected by the first detector 69c, a second gain adjusting amplifier 72c configured to amplify the frequency signal detected by the second detector 70c, a first AD converter 79c configured to perform AD conversion of the frequency signal amplified by the first gain adjusting amplifier 71c, and a second AD converter 80c configured to perform AD conversion of the frequency signal amplified by the second gain adjusting amplifier 72c. The spectrum level comparing unit 64c also includes a CPU 104 configured to input the digital data converted by the first and second AD converters 79c and 80c, and a memory 103 which is capable of transmitting and receiving data to and from the CPU 104 and serves as a storage unit for recording data.

The respective configurations of the first band-pass filter 67c, the second band-pass filter 68c, the first detector 69c, the second detector 70c, the first gain adjusting amplifier 71c, and the second gain adjusting amplifier 72c are the same as those of the first band-pass filter 67b and the like according to the other exemplary embodiment as illustrated in FIG. 19, and thus a description thereof will be omitted. The analog data of the frequency signal amplified by the first gain adjusting amplifier 71c are converted into digital data by the first AD converter 79c. In the same manner, the analog data of the frequency signal amplified by the second gain adjusting amplifier 72c are converted into digital data by the second AD converter 80c. That is, the respective analog data are AD-converted. Then, the AD-converted digital data of the respective frequency signals are input to the CPU 104. Here, in the memory 103, a threshold value is recorded. The CPU 104 acquires the threshold value from the memory 103, and performs calculation by using the input digital data of the respective frequency signals. Specifically, the CPU 104 calculates a difference between the value of the digital data input by the first AD converter 79c and the value of the digital data input by the second AD converter 80c, and compares the calculated value of the difference to the threshold value acquired from the memory 103. The threshold value is a digital data value corresponding to 40.0 dBm according to the exemplary embodiment as illustrated in, for example, FIG. 17. The determination result through the comparison is notified by the alarm 105.

According to the other exemplary embodiment as described above, the digital data may be recorded by the memory 103, and then the digital data may be acquired to be effectively used for, for example, management or recording of a status of the magnetron 42. Also, any values such as, for example, the threshold value, or digital data may be easily set and input.

Meanwhile, the above described exemplary embodiments, as a high-frequency oscillator, a magnetron is used, but the present disclosure is not limited thereto. The exemplary embodiments may also be applied to other high-frequency oscillators other than the magnetron.

Meanwhile, in the above described exemplary embodiments, a band-pass filter is used as a member for filtering. However, in this case, a low-pass filter (LPF) or a high-pass filter (HPF) may be used in combination, or as necessary, any one of them may be used.

In the above described exemplary embodiments, the plasma processing is performed by using a microwave through the radial line slot antenna, but the present disclosure is not limited thereto. It is possible to employ a plasma processing apparatus which has a comb-shaped antenna unit and is configured to generate plasma by a microwave, or a plasma processing apparatus which generates plasma by radiating a microwave from a slot.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a processing container;
a plasma generating mechanism including a high-frequency oscillator, and configured to generate plasma within the processing container by using a high frequency wave oscillated by the high-frequency oscillator;
an impedance regulator configured to adjust impedance to be applied to the high-frequency oscillator; and
a determining unit configured to change the impedance to be adjusted by the impedance regulator, and to determine an abnormal oscillation of the high-frequency oscillator based on a component of a center frequency of a fundamental wave that is the high frequency wave oscillated by the high-frequency oscillator and a component of a peripheral frequency present at both ends of a predetermined frequency band centered around the center frequency of the fundamental wave in a state where the impedance is changed.

2. The plasma processing apparatus of claim 1, further comprising a spectrum level detecting unit configured to detect a spectrum level of the component of the center frequency and a spectrum level of the component of the peripheral frequency,
wherein the determining unit calculates a difference between a value of the spectrum level of the component of the center frequency and a value of the spectrum level of the component of the peripheral frequency, the spectrum levels being detected by the spectrum level detecting unit, in a state where the impedance is changed, determines whether the calculated value of the difference is not greater than a predetermined threshold value, and determines that the abnormal oscillation of the high-frequency oscillator has occurred when it is determined that the value of the difference is not greater than the threshold value.

3. The plasma processing apparatus of claim 2, wherein the spectrum level detecting unit detects the spectrum level of the component of the center frequency, and spectrum levels of components of a plurality of peripheral frequencies,
the determining unit calculates a first difference between a value of the spectrum level of the component of the center frequency and a value of the spectrum level of the component of one of the plurality of peripheral frequencies, the spectrum levels being detected by the spectrum level detecting unit, in a state where the impedance is changed, and a second difference between the value of the spectrum level of the component of the center frequency and a value of the spectrum level of the component of another peripheral frequency which is different from the one peripheral frequency;
determines whether the calculated value of the first difference is not greater than the threshold value and the calculated value of the second difference is not greater than another threshold value which is different from the threshold value, and
determines that the abnormal oscillation of the high-frequency oscillator has occurred when the value of the first difference is not greater than the threshold value and the value of the second difference is not greater than the another threshold value.

4. The plasma processing apparatus of claim 1, wherein the determining unit determines the abnormal oscillation of the high-frequency oscillator based on the component of the center frequency of the fundamental wave, and a component of a frequency of a different frequency wave occurring outside of both ends of the predetermined frequency band centered around the center frequency of the fundamental wave in a state where the impedance is changed.

5. The plasma processing apparatus of claim 1, further comprising a notification unit configured to notify a determination result made by the determining unit.

6. A method of determining an abnormal oscillation using a plasma processing apparatus which comprises a processing container, a plasma generating mechanism including a high-frequency oscillator, and configured to generate plasma within the processing container by using a high frequency wave oscillated by the high-frequency oscillator, and an impedance regulator configured to adjust impedance to be applied to the high-frequency oscillator, the method comprising:
changing the impedance to be adjusted by the impedance regulator, and
determining the abnormal oscillation of the high-frequency oscillator based on a component of a center frequency of a fundamental wave that is the high frequency wave oscillated by the high-frequency oscillator and a component of a peripheral frequency present at both ends of a predetermined frequency band centered around the center frequency of the fundamental wave in a state where the impedance is changed.

7. A high-frequency generator comprising:

a high-frequency oscillator configured to oscillate a high frequency wave;

an impedance regulator configured to adjust impedance to be applied to the high-frequency oscillator; and a determining unit configured to change the impedance to be adjusted by the impedance regulator and to determine the abnormal oscillation of the high-frequency oscillator based on a component of a center frequency of a fundamental wave that is the high frequency wave oscillated by the high-frequency oscillator and a component of a peripheral frequency present at both ends of a predetermined frequency band centered around the center frequency of the fundamental wave in a state where the impedance is changed.

* * * * *